(12) United States Patent
Hanamura et al.

(10) Patent No.: US 10,269,882 B2
(45) Date of Patent: Apr. 23, 2019

(54) ORGANIC EL DEVICE, METHOD OF MANUFACTURING ORGANIC EL DEVICE, AND ELECTRONIC DEVICE

(71) Applicant: SEIKO EPSON CORPORATION, Tokyo (JP)

(72) Inventors: Yuki Hanamura, Azumino (JP); Koya Shiratori, Matsumoto (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 6 days.

(21) Appl. No.: 15/217,201

(22) Filed: Jul. 22, 2016

(65) Prior Publication Data

US 2017/0104045 A1  Apr. 13, 2017

(30) Foreign Application Priority Data

Oct. 7, 2015 (JP) ................. 2015-199159

(51) Int. Cl.
    H01L 27/32    (2006.01)
    H01L 51/52    (2006.01)
    H01L 51/56    (2006.01)
    H01L 27/12    (2006.01)

(52) U.S. Cl.
    CPC ........ *H01L 27/3248* (2013.01); *H01L 27/322* (2013.01); *H01L 27/3206* (2013.01); *H01L 51/5206* (2013.01); *H01L 51/5221* (2013.01); *H01L 51/5265* (2013.01); *H01L 51/56* (2013.01); *H01L 27/1214* (2013.01); *H01L 27/3211* (2013.01); *H01L 27/3216* (2013.01); *H01L 27/3262* (2013.01); *H01L 51/5246* (2013.01); *H01L 51/5253* (2013.01); *H01L 51/5271* (2013.01); *H01L 2227/323* (2013.01); *H01L 2251/5315* (2013.01); *H01L 2251/558* (2013.01)

(58) Field of Classification Search
    CPC .......... H01L 27/32; H01L 51/52; H01L 51/56
    See application file for complete search history.

(56) References Cited

U.S. PATENT DOCUMENTS

| 2012/0038267 | A1 | 2/2012 | Hanamura et al. |
| 2014/0117334 | A1* | 5/2014 | Nakamura ............ H01L 27/322 257/40 |
| 2014/0117842 | A1 | 5/2014 | Hanamura |

FOREIGN PATENT DOCUMENTS

| JP | 2008-066216 A | 3/2008 |
| JP | 2012-038677 A | 2/2012 |
| JP | 2014-089804 A | 5/2014 |
| JP | 2015-050096 A | 3/2015 |
| JP | 201550096 A * | 3/2015 ............ H05B 33/12 |
| JP | 2015-173003 A | 10/2015 |

* cited by examiner

*Primary Examiner* — Thanh T Nguyen
(74) *Attorney, Agent, or Firm* — Oliff PLC

(57) ABSTRACT

Provided is an organic EL device including a first substrate, a first organic EL element and a second organic EL element which is provided on the first substrate, a sealing layer which covers the first organic EL element and the second organic EL element, and a color filter which is provided on the sealing layer. The color filter includes a coloring layer overlapping the first organic EL element in a planar view, and a resin layer overlapping the second organic EL element in a planar view.

15 Claims, 14 Drawing Sheets

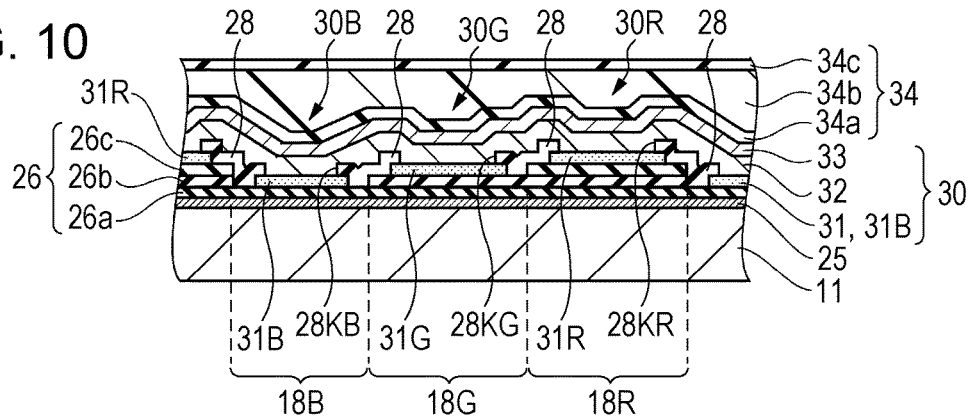
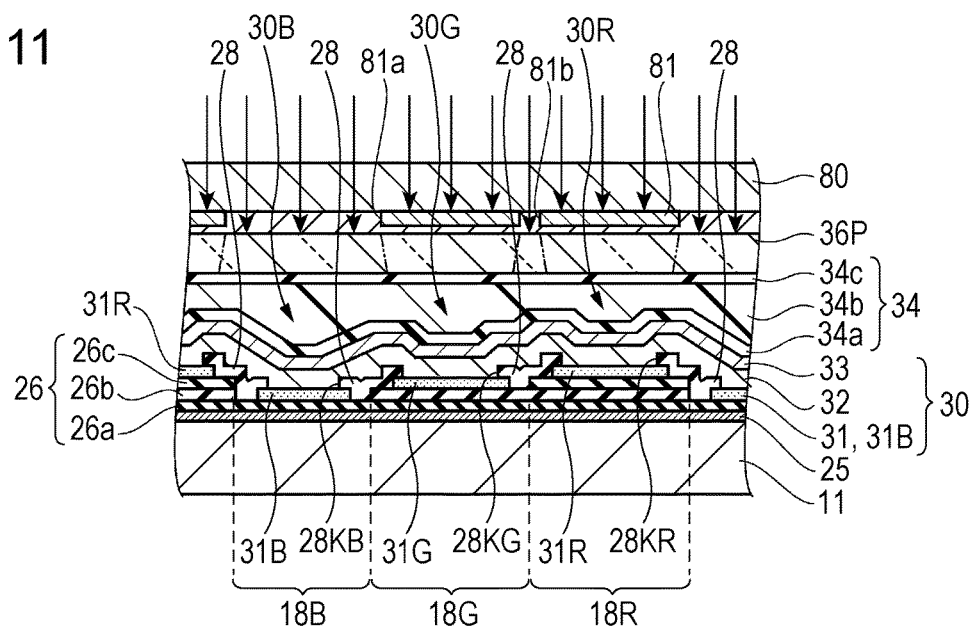
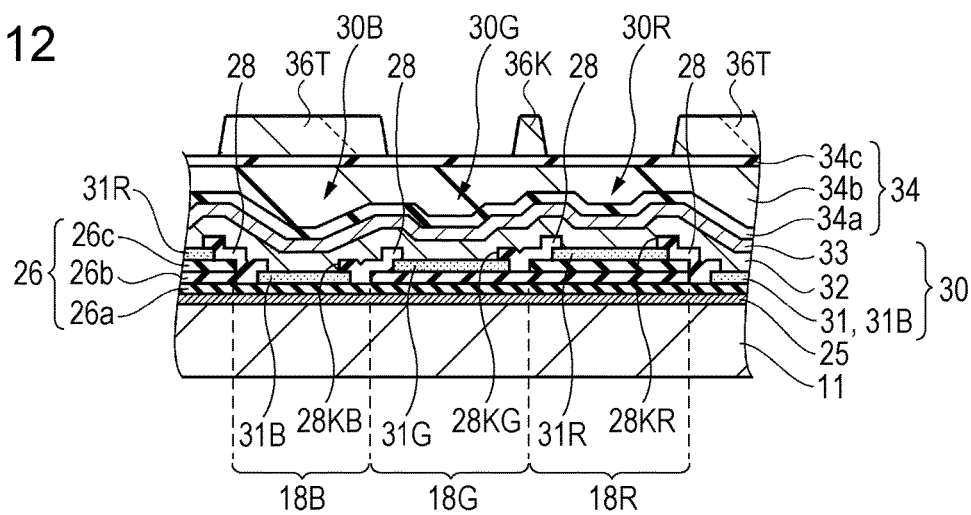

ORGANIC EL DEVICE, METHOD OF MANUFACTURING ORGANIC EL DEVICE, AND ELECTRONIC DEVICE

BACKGROUND

1. Technical Field

The present invention relates to an organic EL device which is provided with an electro-luminescence (EL) element, a method of manufacturing the organic EL device, and an electronic device which is provided with the organic EL device.

2. Related Art

Since the organic EL element can be easily miniaturized and thinned as compared with a light emitting diode (LED), the organic EL element being applied to a microdisplay such as a head-mounted display (HMD) and an electronic viewer (EVF), as a light-emitting element has attracted attention.

As means for realizing a color display in such a microdisplay, a configuration of combining an organic EL element which can emit white light with a color filter is considered. When the light emitted from the organic EL element is incident on a predetermined coloring layer in the color filter, it is possible to realize excellent display quality, and thus arranging the coloring layers in a position closer to the organic EL element has been proposed.

For example, JP-A-2008-66216, JP-A-2012-38677, and JP-A-2014-89804 disclose an example of arranging coloring layers which have at least three colors (red, green, and blue) on a gas barrier layer, a protective layer, or a sealing layer which cover a plurality of the organic EL elements so as to correspond to the disposition of the organic EL elements. In addition, an example of disposing a black matrix layer between the coloring layers, or disposing a projecting portion having translucency or light-shielding properties is described.

However, in the organic EL device disclosed in JP-A-2008-66216, JP-A-2012-38677, and JP-A-2014-89804, white light emitted from the organic EL element is emitted by transmitting through the coloring layer, and thus it is difficult to realize a desired luminance in color light which is obtained by converting the white light by the coloring layer, which is a problem. For example, as the amount of current is increased in the organic EL element such that the luminance of the white light is increased in order to secure the luminance of light, power consumption of the organic EL device is increased, and thus emission lifetime of the organic EL element becomes shortened, which is a problem.

SUMMARY

The invention can be realized in the following aspects or application examples.

Application Example

According to this application example, there is provided an organic EL device including a first substrate; a first organic EL element and a second organic EL element which are provided on the first substrate; a sealing layer which covers the first organic EL element and the second organic EL element; and a color filter which is provided on the sealing layer, in which the color filter includes a coloring layer which overlaps the first organic EL element in a planar view, and a transparent layer which overlaps the second organic EL element in a planar view.

In this case, in a case where the light which is emitted from the second organic EL element is emitted by transmitting through the sealing layer and the transparent layer, the luminance is less likely to be weakened as compared with a case where the light which is emitted from the first organic EL element is emitted by transmitting through the sealing layer and the coloring layer. That is, as compared with the case of including the coloring layer which overlaps the second organic EL element in a planar view, it is possible to provide an organic EL device which can realize a desired luminance without increasing power consumption, and decreasing emission lifetime of the organic EL element.

In the organic EL device according to the application example, it is preferable that the first organic EL element and the second organic EL element are disposed on the first substrate so as to be adjacent to each other in one direction, and the transparent layer is provided between the first organic EL element and the second organic EL element in the one direction so as to come in contact with the coloring layer.

With such a configuration, the coloring layer can be accurately positioned on the sealing layer based on the transparent layer. Accordingly, the light emitted from the first organic EL element can reliably transmit through the coloring layer so as to be extracted. For this reason, it is possible to provide an organic EL device having excellent display quality.

In the organic EL device according to the application example, it is preferable that a first driving transistor which is provided on the first substrate, and is connected to the first organic EL element via a first contact portion; and a second driving transistor which is connected to the second organic EL element via a second contact portion are further included, in which the coloring layer is provided in such a manner that the first contact portion and the second contact portion are overlapped with each other in a planar view.

The first contact portion and the second contact portion may have irregularities as compared with other portions of the first and second organic EL elements. If the emitted light is scattered in the portion where the irregularities are generated, the optical properties may be caused to be deteriorated. With such a configuration, the coloring layer is provided in such a manner that the first contact portion and the second contact portion are overlapped with each other in a planar view, and thus at least a portion of the unnecessary emitted light which is scattered in the portion where the irregularities are generated is absorbed by the coloring layer, thereby preventing the optical properties from being deteriorated.

In the organic EL device according to the application example, it is preferable that a main component of the coloring layer and the transparent layer is a photosensitive resin having light transmissivity.

With such a configuration, it is possible to form the coloring layer and the transparent layer by using a photolithography method, and thus the coloring layer and the transparent layer can be disposed on the sealing layer with high positional accuracy.

In the organic EL device according to the application example, it is preferable that the photosensitive resin is a photosensitive acrylic resin.

With such a configuration, it is possible to make the transparent layer be excellent in light transmissivity.

In the organic EL device according to the application example, it is preferable that each of the first organic EL element and the second organic EL element include a pixel electrode having light transmissivity, a counter electrode having both the light transmissivity and reflectivity, and a light-emitting function layer disposed between the pixel electrode and the counter electrode, a reflective layer between a substrate main body of the first substrate and the pixel electrode is further included, in which in the first organic EL element and the second organic EL element, optical distances between the reflective layer and the counter electrode are different from each other.

With such a configuration, the light having resonant wavelengths which are different from each other is emitted from the first organic EL element and the second organic EL element. The color purity of the light emitted from the first organic EL element is further enhanced by transmitting through the coloring layer. In addition, the light emitted from the second organic EL element transmits through the transparent layer, and the light having the color purity based on the resonant wavelength can be extracted. That is, it is possible to realize highly attractive color display.

In the organic EL device according to the application example, it is preferable that a second substrate having the light transmissivity on the color filter via a filler is further included.

With such a configuration, since the second substrate is included in addition to the sealing layer, it is possible to prevent moisture and oxygen from the outside from entering the organic EL element such that the light can be stable emitted and thus it is possible to provide an organic EL device having a long emission lifetime.

In the organic EL device according to the application example, it is preferable that a light-emitting area of the second organic EL element is smaller than a light-emitting area of the first organic EL element.

With such a configuration, since the light emitted from the second organic EL element is extracted by transmitting through the transparent layer, even in a case where the light-emitting area of the second organic EL element is set to be small, it is possible to obtain a desired brightness as compared with the first organic EL element.

In the organic EL device according to the application example, it is preferable that the light-emitting area of the second organic EL element is larger than the light-emitting area of the first organic EL element.

With such a configuration, the brightness of the light emitted from the organic EL element is dependent on the light-emitting area. That is, as the light-emitting area of the second organic EL element is increased, it is possible to extract the light having the brightness, which is the equivalent to the light emitted from the first organic EL element by the current amount which is smaller than the current amount following into the first organic EL element, from the second organic EL element.

As described above, when the light-emitting area of the second organic EL element in which the emitted light transmits through the transparent layer is adjusted with respect to the light-emitting area of the first organic EL element in which the emitted light transmits through the coloring layer, it is possible to adjust the brightness between the first organic EL element and the second organic EL element, and it is possible to adjust power consumption, and thus it is possible to realize the organic EL device having the optical properties including emission lifetime.

Application Example

According to this application example, there is provided a method of manufacturing an organic EL device including forming a first organic EL element and a second organic EL element on a first substrate; forming a sealing layer which covers the first organic EL element and the second organic EL element; and forming a coloring layer at a position overlapping the first organic EL element in a planar view, and forming a color filter which forms a transparent layer at a position overlapping the second organic EL element in a planar view, on the sealing layer.

In this case, the organic EL device in which the light emitted from the first organic EL element is emitted by transmitting through the sealing layer and the coloring layer, and the light emitted from the second organic EL element is emitted by transmitting through the sealing layer and the transparent layer. Accordingly, as compared with the first organic EL element, the light emitted from the second organic EL element is less likely to cause the deterioration of the luminance. That is, as compared with the case of forming the coloring layer which overlaps the second organic EL element in a planar view, it is possible to provide an organic EL device which can realize a desired luminance without increasing power consumption, and decreasing emission lifetime of the organic EL element.

In the method of manufacturing an organic EL device according to the application example, it is preferable that in the forming of the color filter, the coloring layer is formed in such a manner that a photosensitive resin layer which contains a coloring material is formed, and then exposed and developed, and the transparent layer is formed in such a manner that a photosensitive resin layer which does not contain a coloring material is formed, and then exposed and developed.

With such a method, it is possible to form the coloring layer and the transparent layer by using a photolithography method, and thus the coloring layer and the transparent layer can be disposed on the sealing layer with high positional accuracy.

In the method of manufacturing an organic EL device according to the application example, it is preferable that in the forming of the color filter, the coloring layer is formed after forming the transparent layer.

With such a method, in a case where the coloring layer and the transparent layer are formed by using a photolithography method, the transparent layer is further likely to realize high positional accuracy. Accordingly, it is possible to form the coloring layer with high positional accuracy based on the transparent layer by forming the transparent layer first.

In the method of manufacturing an organic EL device according to the application example, it is preferable that the method further includes forming a first driving transistor and a second driving transistor on the first substrate; forming an interlayer insulating film which covers the first driving transistor and the second driving transistor; and forming a first contact portion which causes the first driving transistor and the first organic EL element to be connected to each other, and a second contact portion which causes the second driving transistor and the second organic EL element to be connected to each other, on the interlayer insulating film, in which in the forming of the color filter, the coloring layer is formed such that the first contact portion and the second contact portion are overlapped with each other in a planar view.

The first contact portion and the second contact portion may have irregularities as compared with other portions of the first and second organic EL elements. If the emitted light is scattered in the portion where the irregularities are generated, the optical properties may be caused to be deteriorated. With such a method, the coloring layer is provided in such a manner that the first contact portion and the second contact portion are overlapped with each other in a planar view, and thus at least a portion of the unnecessary emitted light which is scattered in the portion where the irregularities are generated is absorbed by the coloring layer, thereby preventing the optical properties from being deteriorated.

In the method of manufacturing an organic EL device according to the application example, it is preferable that each of the first organic EL element and the second organic EL element include a pixel electrode having the light transmissivity, a counter electrode having both the light transmissivity and reflectivity, and a light-emitting function layer between the pixel electrode and the counter electrode, and the method further includes forming a reflective layer between a substrate main body of the first substrate and the pixel electrode; and forming a transparent layer between the reflective layer and the pixel electrode, in which the thickness of at least one of the pixel electrode and the transparent layer is adjusted such that optical distances between the reflective layer and the counter electrode are different from each other in the first organic EL element and the second organic EL element.

With such a method, an optical resonator structure is formed corresponding to each of the first organic EL element and the second organic EL element, and the light having resonant wavelengths which are different from each other is emitted from the first organic EL element and the second organic EL element. The color purity of the light emitted from the first organic EL element is further enhanced by transmitting through the coloring layer. In addition, the light emitted from the second organic EL element transmits through the transparent layer, and the light having the color purity based on the resonant wavelength can be extracted. That is, it is possible to manufacture the organic EL device which can realize highly attractive color display.

In the method of manufacturing an organic EL device according to the application example, it is preferable that the method further includes coating the coloring layer and the transparent layer with a filler such that the coloring layer and the transparent layer are covered; and bonding a second substrate having light transmissivity to the first substrate via the filler.

With such a method, since the second substrate is bonded to the first substrate via the filler in addition to the sealing layer, it is possible to prevent moisture and oxygen from the outside from entering the organic EL element such that the light can be stably emitted and thus it is possible to manufacture an organic EL device having a long emission lifetime.

Application Example

According to this application example, there is provided an electronic device including the organic EL device according to the above described application examples.

In this case, with the organic EL device having excellent optical properties, it is possible to provide an electronic device having high display quality.

BRIEF DESCRIPTION OF THE DRAWINGS

The invention will be described with reference to the accompanying drawings, wherein like numbers reference like elements.

FIG. 10 is a sectional view schematically illustrating the method of manufacturing the organic EL device of the first embodiment.

FIG. 11 is a sectional view schematically illustrating the method of manufacturing the organic EL device of the first embodiment.

FIG. 12 is a sectional view schematically illustrating the method of manufacturing the organic EL device of the first embodiment.

DESCRIPTION OF EXEMPLARY EMBODIMENTS

Hereinafter, the invention will be described in detail with reference to the drawings. Note that, the following drawings are appropriately enlarged or reduced such that the parts described are recognizable.

First Embodiment

Organic EL Device

Figure 1:
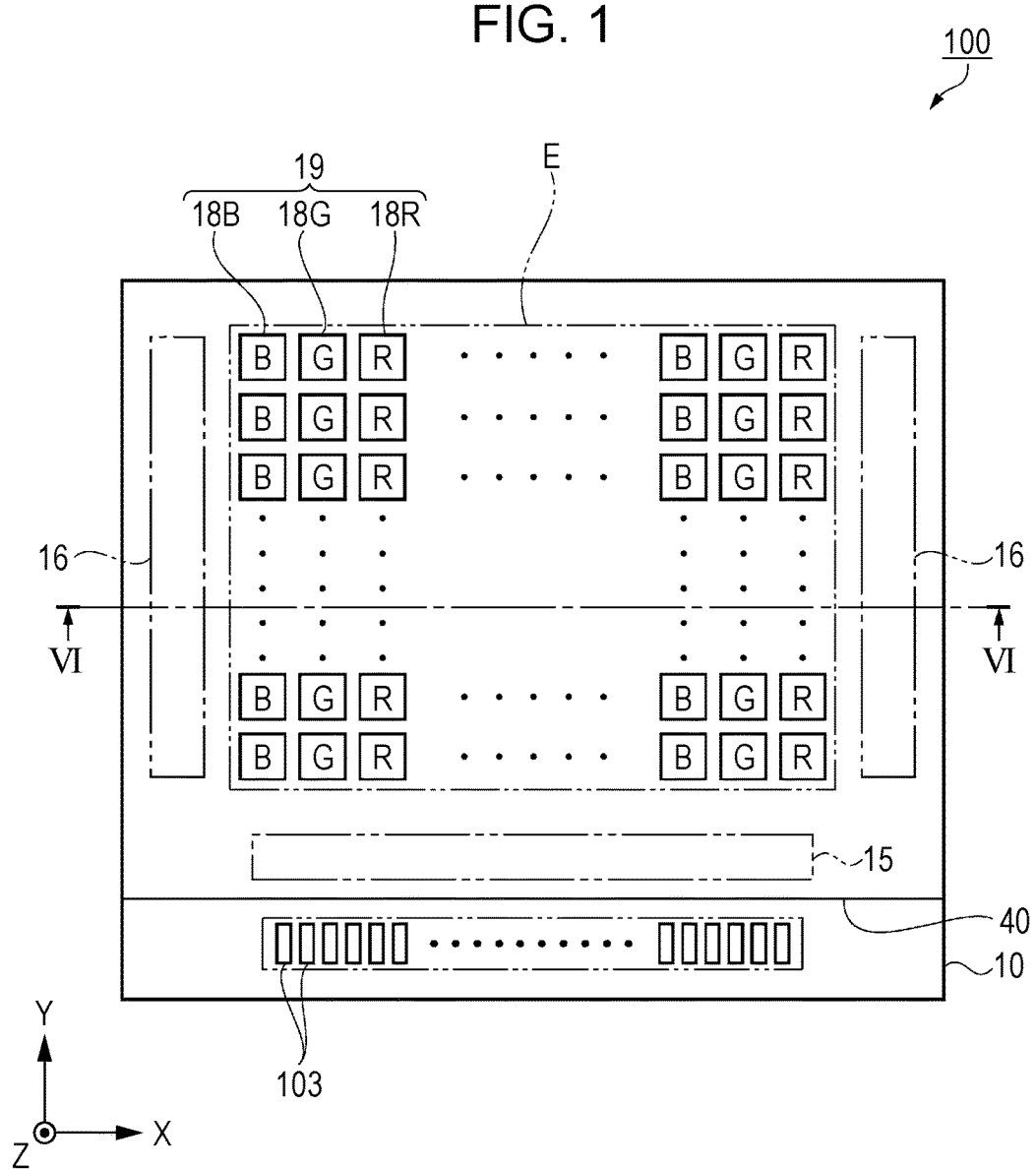
FIG. 1 is a schematic plan view illustrating a configuration of an organic EL device of first embodiment.
Figure 2:
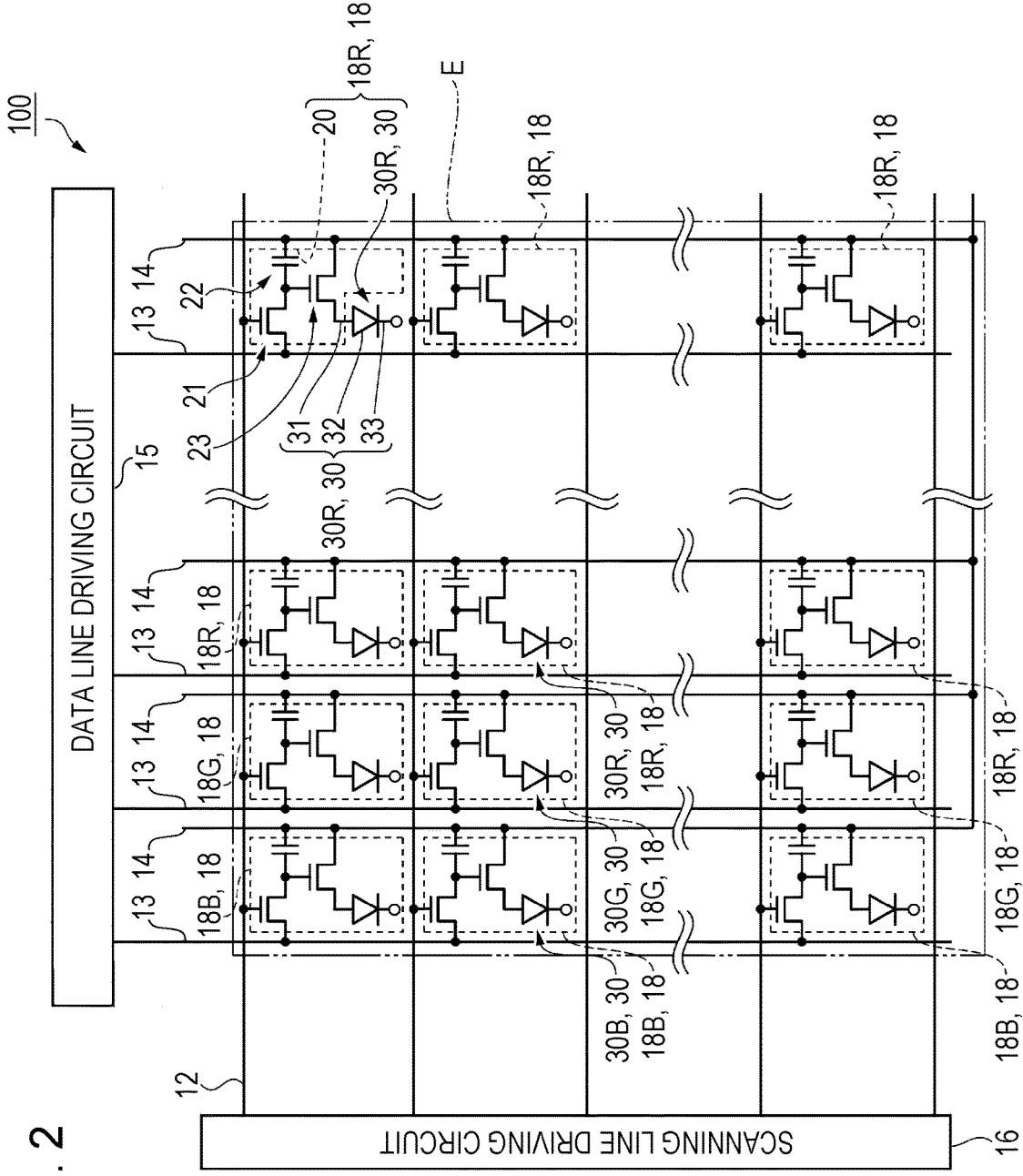
FIG. 2 is an equivalent circuit diagram illustrating an electrical configuration of the organic EL device.
Figure 3:
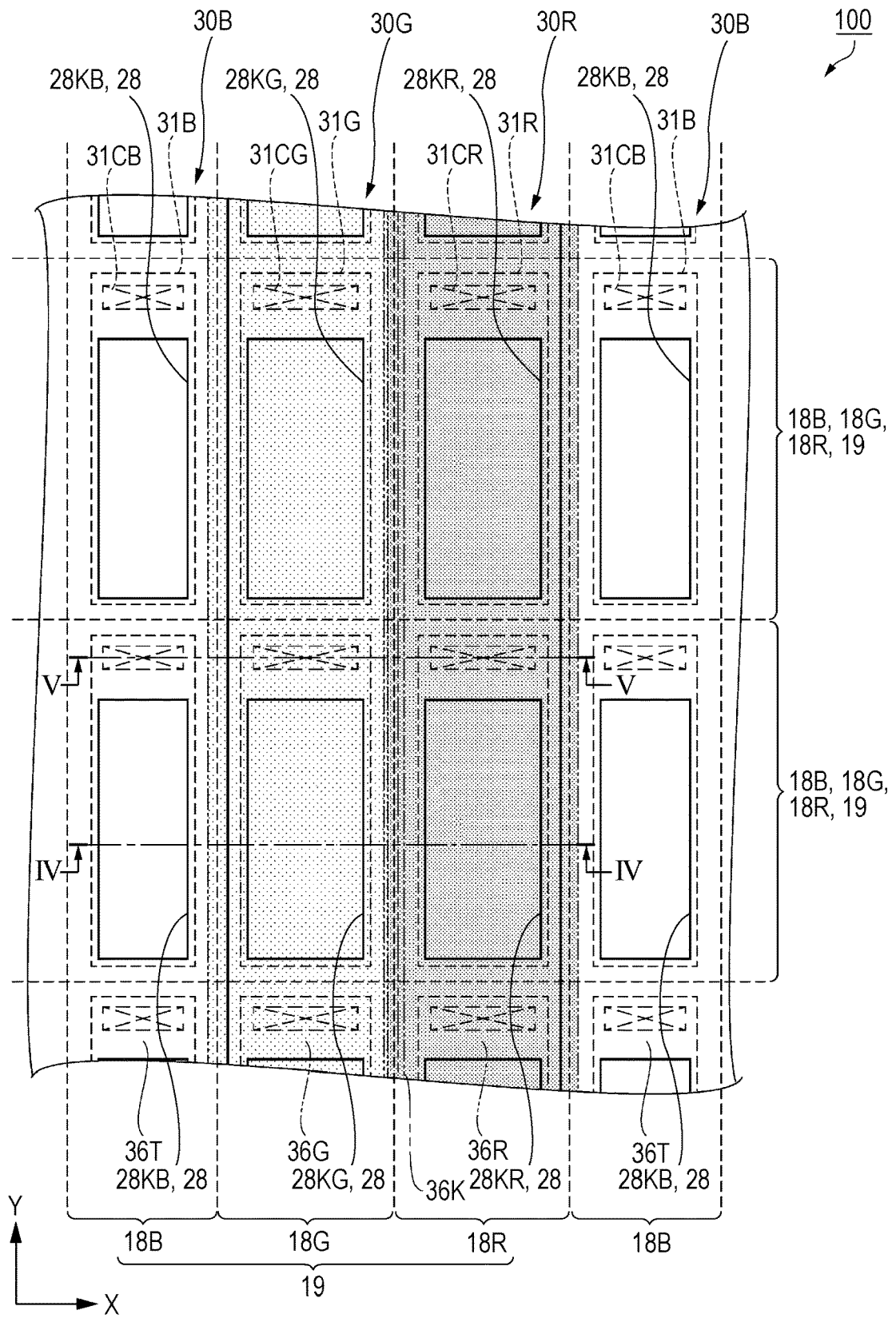
FIG. 3 is a schematic plan view illustrating disposition of organic EL elements and color filters in a sub-pixel of the organic EL device.
Figure 4:
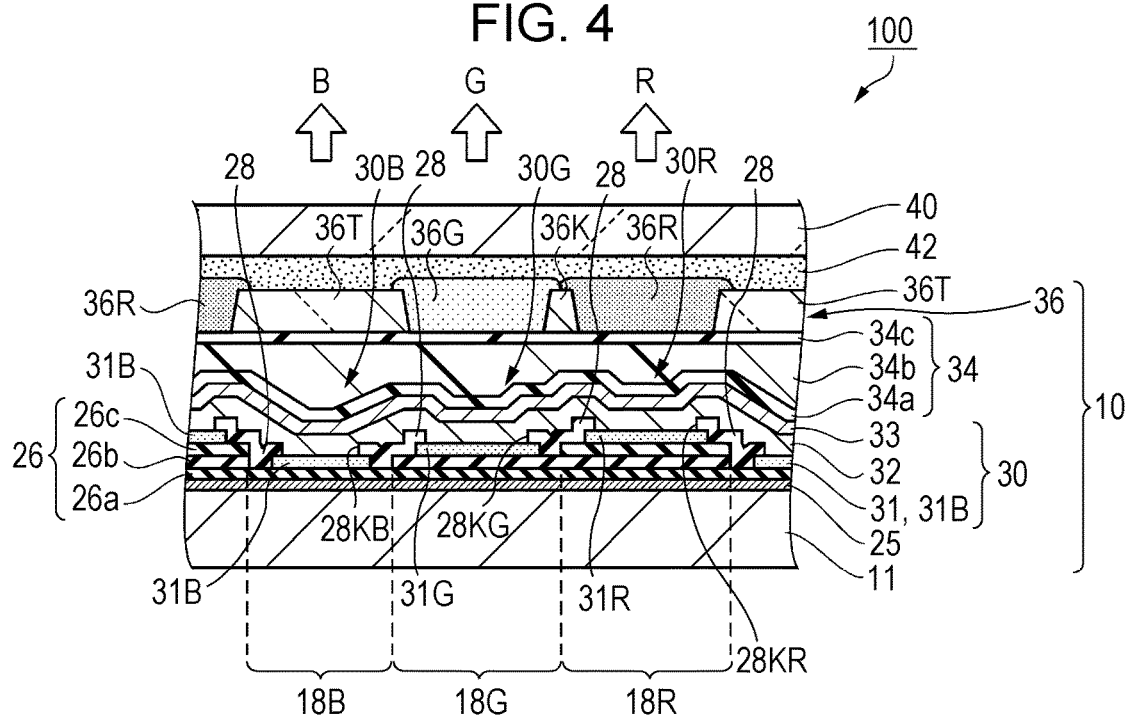
FIG. 4 is a sectional view schematically illustrating a structure of the sub-pixel taken along line IV-IV in FIG. 3.
Figure 5:
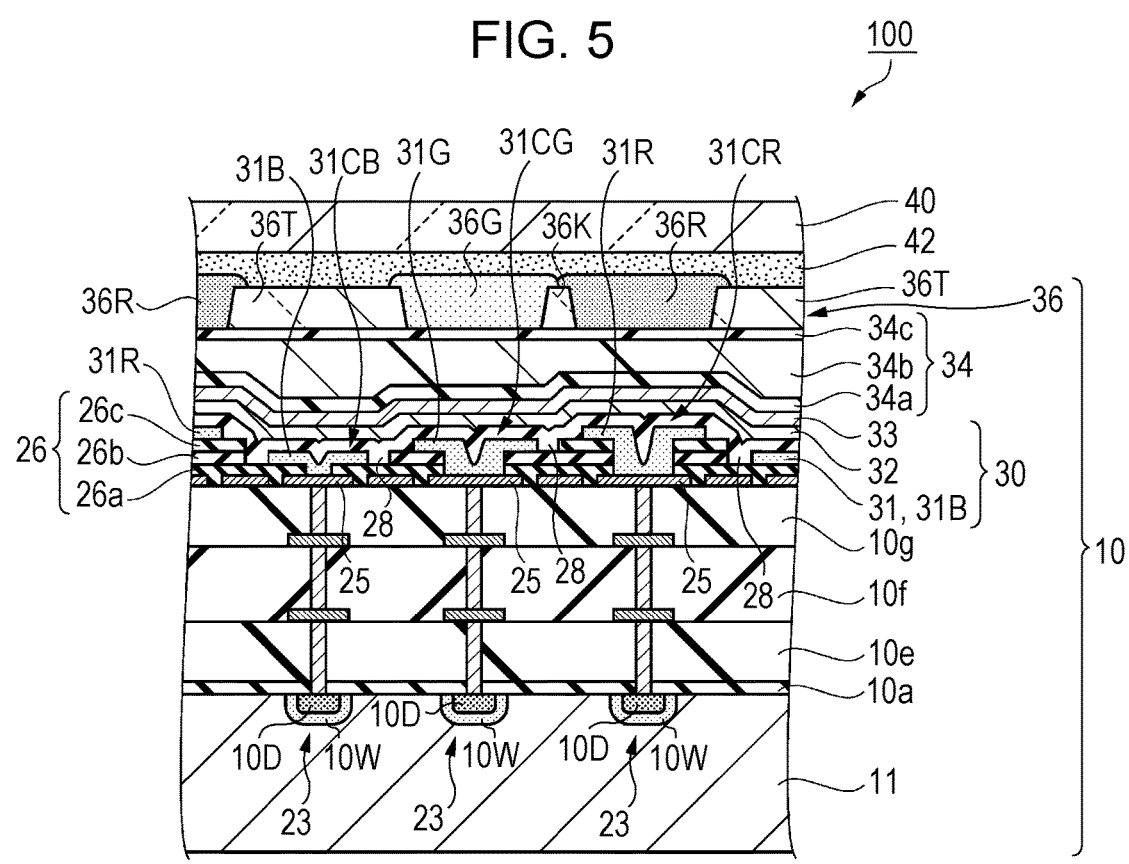
FIG. 5 is a sectional view schematically illustrating a structure of a contact portion of a pixel electrode in the sub-pixel taken along line V-V in FIG. 3.

First, the organic EL device of the embodiment will be described with reference to FIG. 1 to FIG. 5. FIG. 1 is a schematic plan view illustrating a configuration of an organic EL device of a first embodiment, FIG. 2 is an equivalent circuit diagram illustrating an electrical configuration of the organic EL device, and FIG. 3 is a schematic plan view illustrating disposition of organic EL elements and color filters in a sub-pixel of the organic EL device. FIG. 4 is a sectional view schematically illustrating a structure of the sub-pixel taken along line IV-IV in FIG. 3, and FIG. 5 is a sectional view schematically illustrating a structure of a contact portion of a pixel electrode in the sub-pixel taken along line V-V in FIG. 3.

The organic EL device 100 according to the embodiment is a white light emitting-type microdisplay which is preferable as a display portion of a head-mounted display (HMD) described below.

As illustrated in FIG. 1, an organic EL device 100 of the embodiment includes an element substrate 10 and a protective substrate 40. Both substrates which are oppositely disposed are bonded to each other via a filler 42 (refer to FIG. 4).

Meanwhile, the element substrate 10 is an example of "a first substrate" in the invention. The protective substrate 40 is an example of "a second substrate" in the invention.

The element substrate 10 includes a display region E in which a sub-pixel 18B for emitting blue (B) light, a sub-pixel 18G for emitting green (G) light, and a sub-pixel 18R for emitting red (R) light are arranged. The organic EL device 100 provides full color display by using a pixel 19 including the sub-pixel 18B, the sub-pixel 18G, and the sub-pixel 18R as a display unit.

In the following description, the sub-pixel 18B, the sub-pixel 18G, and the sub-pixel 18R may be collectively referred to as the sub-pixel 18.

The element substrate 10 is larger than the protective substrate 40, and a plurality of external connection terminals 103 are arranged along a first side of the element substrate 10 and protrudes from the protective substrate 40. A data line driving circuit 15 is provided between the plurality of external connection terminals 103 and the display region E. A scanning line driving circuit 16a is provided between a second side and a third side which are orthogonal to the first side, and face each other, and the display region E.

The protective substrate 40 is smaller than the element substrate 10, and is disposed such that the external connection terminal 103 is exposed. The protective substrate 40 is a substrate having light transmissivity, for example, can be formed by using a quartz substrate, a glass substrate, or the like. In the embodiment, the light transmittance in a visible light wavelength range of the protective substrate 40 is preferably equal to or greater than 80%, and is further preferably equal to or greater than 90%. In the display region E, the protective substrate 40 has a function of protecting an organic EL element 30 (refer to FIG. 2) described below, which is disposed in the sub-pixel 18 is not damaged, and is disposed so as to face the display region E at least. The organic EL device 100 of the embodiment employs a top emission type in which the light emitted from the sub-pixel 18 is extracted from the protective substrate 40 side.

Hereinafter, a direction along the first side on which the external connection terminals 103 are arranged is set to be a X direction, and a direction in which two other sides (the second side and the third side) which are orthogonal to the first side and face each other are set to be a Y direction. A direction which faces the protective substrate 40 from element substrate 10 is set to be a Z direction. In addition, a "planar view" means the view from the protective substrate 40 side along the Z direction. Note that, the X direction corresponds to "one direction" in the invention.

In the embodiment, in the display region E, the disposition of the sub-pixels 18 applies a so-called stripe-type in which the sub-pixels 18 obtaining the same color light are arranged in a column direction (the Y direction), and the sub-pixels 18 obtaining different color lights are arranged in a line direction (the X direction). The organic EL element 30 and color filters 36 (refer to FIG. 3 or FIG. 4) are arranged in the sub-pixel 18. The configuration of the organic EL element 30 and the color filter 36 will be described below in detail.

Note that, FIG. 1 illustrates the disposition of the sub-pixels 18B, 18G, and 18R in the display region E, and the sub-pixels 18 in the line direction (the X direction) is not limited to be arranged in order of B, G, and R. For example, the sub-pixels 18 may be arranged in order of G, B, and R. In addition, the disposition of the sub-pixels 18 is not limited to the stripe type, and for example, a Delta type, a Bayer type, or an S stripe type may be employed. In addition, the shapes and sizes of the sub-pixels 18B, 18G, and 18R are not necessary to be the same as each other.

Electrical Configuration of Organic EL Device

As illustrated in FIG. 2, the organic EL device 100 includes a scanning line 12 and a data line 13 which interact with each other, and a power line 14. The scanning line 12 is electrically connected to the scanning line driving circuit 16, and the data line 13 is electrically connected to the data line driving circuit 15. In addition, the sub-pixel 18 is provided in a region which is partitioned by the scanning line 12 and the data line 13.

The sub-pixel 18 includes the organic EL element 30, and a pixel circuit 20 which controls the driving of the organic EL element 30. Hereinafter, the organic EL element 30 disposed in the sub-pixel 18B is referred to as an organic EL element 30B, the organic EL element 30 disposed in the sub-pixel 18G is referred to as an organic EL element 30G, and the organic EL element 30 disposed in the sub-pixel 18R is referred to as an organic EL element 30R.

The organic EL element 30 is configured to include a pixel electrode 31, a light-emitting function layer 32, and a counter electrode 33. The pixel electrode 31 serves as an anion which injects holes in the light-emitting function layer 32. The counter electrode 33 severs as a cation which injects electrons to the light-emitting function layer 32. In the light-emitting function layer 32, an exciton (in a state where the hole and the electron are bounded to each other by Coulomb force) is formed by the injected holes and electrons, and when the exciton disappears (the hole and the electron are rebounded to each other) a portion of energy is discharged in a state of being fluorescence or phosphorescence. In the embodiment, the light-emitting function layer 32 is configured such that the white light can be emitted from the light-emitting function layer 32.

In addition, the organic EL element 30B which is disposed in the sub-pixel 18B is an example of "a second organic EL element", and the organic EL element 30G which is disposed in the sub-pixel 18G, or the organic EL element 30R which is disposed in the sub-pixel 18R is an example of "a first organic EL element" of the present invention.

The pixel circuit 20 includes a switching transistor 21, a storage capacitor 22, and a driving transistor 23. Two transistors 21 and 23 can be formed by using, for example, an n-channel type transistor or a p-channel type transistor.

A gate of the switching transistor 21 is electrically connected to the scanning line 12. A source of the switching transistor 21 is electrically connected to the data line 13. A drain of the switching transistor 21 is electrically connected to the gate of the driving transistor 23.

The drain of the driving transistor 23 is electrically connected to the pixel electrode 31 of the organic EL element 30. The source of the driving transistor 23 is electrically connected to the power line 14. The storage capacitor 22 is electrically connected between the gate of the driving transistor 23 and the power line 14.

When the switching transistor 21 is turned on (ON) by driving the scanning line 12 by a control signal supplied from the scanning line driving circuit 16, a potential based on an image signal supplied from the data line 13 is held in the storage capacitor 22 via the switching transistor 21. The driving transistor 23 is turned on or off (ON or OFF state) in response to the potential of the storage capacitor 22, that is, a gate potential of the driving transistor 23. In addition, when the driving transistor 23 is turned on (ON state), via the driving transistor 23, the amount of current corresponding to the gate potential flows into the organic EL element 30 from the power line 14. The organic EL element 30 emits the light having luminance in response to the amount of current flowing into the light-emitting function layer 32.

Note that, the configuration of the pixel circuit 20 is not limited to include two transistors 21 and 23, for example, the pixel circuit 20 is further provided with a transistor for controlling the current which flows into the organic EL element 30.

Disposition of Pixel Electrodes and Color Filters

Next, the disposition of the pixel electrode 31 and the color filter 36 of the organic EL element 30 in the sub-pixel 18 will be described with reference to FIG. 3.

As illustrated in FIG. 3, the pixel electrode 31 of the organic EL element 30 is disposed in each of the plurality of sub-pixels 18 which are arranged in a matrix shape in the X direction and the Y direction. Specifically, the pixel electrode 31B of the organic EL element 30B which is disposed in the sub-pixel 18B, the pixel electrode 31G of the organic EL element 30G which is disposed in the sub-pixel 18G, and the pixel electrode 31R of the organic EL element 30R which is disposed in the sub-pixel 18R are arranged in the X direction. Each of the pixel electrodes 31B, 31G, and 31R is formed into a rectangular shape in a planar view, and is disposed along the Y direction of the longitudinal direction. In the embodiment, the length of each of the pixel electrodes 31B, 31G, and 31R in the Y direction is the same. In addition, the length of the pixel electrode 31B in the X direction is shorter than those of other pixel electrodes 31G and 31R in the X direction.

A contact portion in which the pixel electrode 31 is electrically connected to the aforementioned driving transistor 23 is provided on one end side (the upper end side in FIG. 3) of each of the pixel electrodes 31 in the Y direction. Specifically, a contact portion 31CB is provided in the pixel electrode 31B, a contact portion 31CG is provided in the pixel electrode 31G, and a contact portion 31CR is provided in the pixel electrode 31R.

The pixel electrodes 31B, 31G, and 31R are covered with the insulating layer 28 so as to be insulated from each other. Specifically, the insulating layer 28 is provided so as to cover each of circumferential edge portions including the contact portions 31CB, 31CG, and 31CR in the pixel electrodes 31B, 31G, and 31R. With this, in each of the pixel electrodes 31B, 31G, and 31R, opening portions 28KB, 28KG, and 28KR which are formed into a rectangular shape in a planar view are formed on the pixel electrodes 31B, 31G, and 31R, except for the contact portions 31CB, 31CG, and 31CR. Note that, the shape of the opening portions 28KB, 28KG, and 28KR may be formed into a track shape in which the short side is formed into a circular shape without being limited to the rectangular shape.

In the embodiment, the length of each of the opening portions 28KB, 28KG, and 28KR in the Y direction is the same, and the length of the opening portion 28KB in the X direction is shorter than those of other opening portions 28KG and 28KR in the X direction. In each of the opening portions 28KB, 28KG, and 28KR, a portion in which the pixel electrodes 31B, 31G, and 31R come in contact with the aforementioned light-emitting function layer 32 is a basic light-emitting region (the light-emitting layer) in terms of design. That is, the light-emitting area in the sub-pixel 18B is smaller than that of each of the light-emitting layers in the sub-pixels 18G and 18R.

The color filters 36 which are disposed in such sub-pixels 18B, 18G, and 18R are configured to include a green (G) coloring layer 36G, a red (R) coloring layer 36R, and transparent layers 36K and 36T which are colorless and transparent. Specifically, the transparent layers 36T which are disposed with respect to the plurality of sub-pixels 18B, the coloring layers 36G which are disposed with respect to the plurality of sub-pixels 18G, and the coloring layers 36R which are disposed with respect to the plurality of sub-pixels 18R are respectively arranged in the Y direction. That is, the transparent layer 36T is disposed in a stripe shape to extend in the Y direction so as to overlap the pixel electrode 31B (opening portions 28KB) arranged in the Y direction. The coloring layer 36G is disposed in a stripe shape to extend in the Y direction so as to overlap the pixel electrode 31G (opening portions 28KG) arranged in the Y direction. Similarly, the coloring layer 36R is disposed in a stripe shape to extend in the Y direction so as to overlap the pixel electrode 31R (opening portion 28KR) arranged in the Y direction.

In a boundary between the sub-pixel 18B and the sub-pixel 18G which are adjacent to each other in the X direction, the transparent layer 36T and the coloring layer 36G are disposed so as to be overlapped with each other. In a boundary between the sub-pixel 18G and the sub-pixel 18R which are adjacent to each other in the X direction, the transparent layer 36K is disposed to extend in the Y direction. A width of the transparent layer 36K in the X direction is smaller than a width of the transparent layer 36T in the X direction, and the transparent layer 36K is disposed between the opening portion 28KG and the opening portion 28KR, along the boundary (indicated by dashed line in FIG. 3) between the sub-pixel 18G and the sub-pixel 18R. The coloring layer 36G and the coloring layer 36R are disposed between the opening portion 28KG and the opening portion 28KR, which are adjacent to each other in the X direction, so as to overlap each other with respect to the transparent layer 36K. Meanwhile, the transparent layer 36K and the transparent layer 36T may be disposed in a matrix shape as an integral structure in a planar view by disposing the transparent layer 36K in the boundary (a range of the boundary may include a portion or the entirety of contact portions 31CB, 31CG, and 31CR in a planar view) between the sub-pixels 18 which are adjacent to each other in the Y direction.

Structure of Sub-Pixel

Next, the structure of the sub-pixel 18 in the organic EL device 100 will be described with reference to FIG. 4 and FIG. 5.

As illustrated in FIG. 4, the organic EL device 100 includes the element substrate 10 and the protective substrate 40 which are disposed to face each other via the filler 42. The filler 42 has a function of bonding the element substrate 10 and the protective substrate 40, and is formed of an epoxy resin and an acrylic resin which have the light transmissivity, for example.

The element substrate 10 includes a substrate main body 11, a reflective layer 25, a transparent layer 26, an organic EL element 30, a sealing layer 34, and a color filter 36 which are sequentially stacked on the substrate main body 11 in the Z direction.

The substrate main body 11 is a semiconductor substrate formed of, for example, silicon, and the scanning line 12, the data line 13, the power line 14, the data line driving circuit 15, the scanning line driving circuit 16, the pixel circuit 20 (a switching transistor 21, a storage capacitor 22, and a driving transistor 23), and the like are formed on the substrate main body 11 by using a well-known technique (refer to FIG. 2). The above-described wirings and a circuit configuration are not illustrated in FIG. 4.

Note that, the substrate main body 11 may be a substrate formed of, for example, quartz and glass, without being limited to the semiconductor substrate such as silicon. In other words, the transistor forming the pixel circuit 20 may be a MOS type transistor including an active layer on the semiconductor substrate, or may be a thin-film transistor which is formed on a substrate formed of, for example, quartz and glass, or a field-effect transistor.

The reflective layer 25 is disposed over the sub-pixels 18B, 18G, and 18R, and on which the light emitted from the organic EL elements 30B, 30G, and 30R of the respective sub-pixels 18B, 18G, and 18R is reflected. As a forming material of the reflective layer 25, for example, aluminum and silver which can realize high reflectivity are preferably used. The light reflectance in a visible light wavelength range of the reflective layer 25 is preferably at least equal to or greater than 40%, and is further preferably equal to or greater than 80%.

The organic EL element 30 is provided on the reflective layer 25. The organic EL element 30 is formed of the pixel electrode 31, the light-emitting function layer 32, and the counter electrode 33 which are sequentially stacked in the Z direction. The pixel electrode 31 is formed of a transparent conductive film such as indium tin oxide (ITO), and is formed in an island shape for each of the sub-pixels 18. In the embodiment, the light transmittance in the visible light wavelength range of the pixel electrode 31 is preferably equal to or greater than 50%, and is further preferably equal to or greater than 80%.

The insulating layer 28 is disposed so as to cover the circumferential edge portion of each of the pixel electrodes 31B, 31G, and 31R. As described, in the insulating layer 28, the opening portion 28KB is formed on the pixel electrode 31B, the opening portion 28KG is formed the pixel electrode 31G, and the opening portion 28KR is formed on the pixel electrode 31R. Such an insulating layer 28 is formed of, for example, silicon oxide.

The light-emitting function layer 32 is disposed so as to cover the entire display region E over the sub-pixels 18B, 18G, and 18R. The light-emitting function layer 32 includes, for example, a hole injection layer, a hole transport layer, an organic light-emitting layer, and an electron transport layer which are sequentially stacked in the Z direction. The organic light-emitting layer emits the light in a wavelength range of blue to red. The organic light-emitting layer may be formed of a single layer, or a plurality of layers which include, for example, a blue light-emitting layer, a green-light-emitting layer, and a red light-emitting layer, or a blue light-emitting layer and a yellow light-emitting layer which can obtain the light in a wavelength range of red (R) and green (G).

The counter electrode 33 is disposed so as to cover the light-emitting function layer 32. The counter electrode 33 is formed of, for example, an alloy of magnesium and silver so as to have the light transmissivity and the light reflectance. In the visible light wavelength range, the light transmittance of the counter electrode 33 is preferably equal to or greater than 20%, and is further preferably equal to or greater than 30%. In addition, the light reflectance of the counter electrode 33 is preferably equal to or greater than 20%, and is further preferably equal to or greater than 50%.

The sealing layer 34 which covers the counter electrode 33 is formed of a first sealing layer 34a, a planarization layer 34b, and a second sealing layer 34c which are sequentially stacked in the Z direction.

The first sealing layer 34a and the second sealing layer 34c are formed of, for example, silicon oxide by using a plasma chemical vapor deposition (CVD) method and the like, and has high barrier properties with respect to moisture and oxygen.

The planarization layer 34b is formed of, for example, an epoxy resin or a coating-type inorganic material (silicon oxide or the like). The planarization layer 34b coats a defect (pinhole or crack), a foreign substance, and the like at the time of forming the film of the first sealing layer 34a so as to form a planarized surface.

The gas barrier properties of the sealing layer 34 are not particularly limited as long as the organic EL element 30 can be protected from oxygen and moisture in the atmosphere; however, oxygen permeability is preferably equal to or lower than $0.01$ $cc/m^2/day$. In addition, water vapor permeability is preferably equal to or lower than $7 \times 10^{-3}$ $g/m^2/day$, and is further preferably equal to or lower than $5 \times 10^{-6}$ $g/m^2/day$. The light transmittance of the sealing layer 34 is preferably equal to or greater than 80% with respect to the light emitted from the counter electrode 33. The sealing layer 34 covers the organic EL element 30, and is provided on substantially the entire surface of the element substrate 10. In addition, an opening (not shown) for exposing the external connection terminal 103 (refer to FIG. 1) is provided on the sealing layer 34.

The transparent layer 26 is provided between the reflective layer 25 and the pixel electrode 31 of the organic EL element 30 on the substrate main body 11. The transparent layer 26 is formed of a first insulating layer 26a, a second insulating layer 26b, and a third insulating layer 26c. The first insulating layer 26a is disposed over the sub-pixels 18B, 18G, and 18R on the reflective layer 25. The second insulating layer 26b is stacked on the first insulating layer 26a, and is disposed over the sub-pixel 18G and the sub-pixel 18R. The third insulating layer 26c is stacked on the second insulating layer 26b, and is positioned in the sub-pixel 18R.

That is, the transparent layer 26 of the sub-pixel 18B is formed of the first insulating layer 26a, the transparent layer 26 of the sub-pixel 18G is formed of the first insulating layer 26a and the second insulating layer 26b, and the transparent layer 26 of the sub-pixel 18R is formed of the first insulating layer 26a, the second insulating layer 26b, and the third insulating layer 26c. As a result, an optical distance between the reflective layer 25 and the counter electrode 33 becomes larger in an order of the sub-pixel 18B, the sub-pixel 18G, and the sub-pixel 18R. Meanwhile, the optical distance can be indicated by the total sum of the refractive index and the thickness of each layer between the reflective layer 25 and the counter electrode 33.

Optical Resonator Structure

The light emitted from the light-emitting function layer 32 is repeatedly reflected between the reflective layer 25 and the counter electrode 33, and the optical distance between the reflective layer 25 and the light intensity of a specific wavelength (a resonant wavelength) corresponding to the counter electrode 33 is amplified so as to be emitted as display light in the Z direction from the protective substrate 40.

In the embodiment, the transparent layer 26 has a function of adjusting the optical distance between the reflective layer 25 and the counter electrode 33. In the sub-pixel 18B, the thickness of the transparent layer 26 is set such that the resonant wavelength (a peak wavelength having the maximum luminance) is 470 nm, for example. In the sub-pixel 18G, the thickness of the transparent layer 26 is set such that the resonant wavelength is 540 nm, for example. In the sub-pixel 18R, the thickness of the transparent layer 26 is set such that the resonant wavelength is 610 nm, for example.

As a result, blue light (B) having a peak wavelength of 470 nm is emitted from the sub-pixel 18B, green light (G) having a peak wavelength of 540 nm from the sub-pixel 18G is emitted, and red light (R) having a peak wavelength of 610 nm from the sub-pixel 18R is emitted. In other words, the organic EL device 100 has an optical resonator structure of amplifying the light intensity of a specific wavelength, a blue light component is extracted from the white light emitted from the light-emitting function layer 32 in the sub-pixel 18B, a green light component is extracted from the white light emitted from the light-emitting function layer 32 in the sub-pixel 18G, and a red light component is extracted from the white light from the light-emitting function layer 32 in the sub-pixel 18R.

In such sub-pixels 18B, 18G, and 18R, the color filter 36 is disposed on the sealing layer 34. The transparent layer 36T is disposed in the organic EL element 30B of the sub-pixel 18B via the sealing layer 34. Accordingly, the blue light (B) having a peak wavelength of 470 nm is emitted from the protective substrate 40 nearly without lowering the luminance.

In contrast, the coloring layer 36G is disposed on the organic EL element 30G of the sub-pixel 18G via the sealing layer 34, and the coloring layer 36R is disposed on the organic EL element 30R of the sub-pixel 18R via the sealing layer 34. Accordingly, the color purity of the green light (G) having a peak wavelength of 540 nm is improved by transmitting the coloring layer 36G, and the color purity of the red light (R) having a peak wavelength of 610 nm is improved by transmitting the coloring layer 36R. On the other hand, the luminance of the green light (G) and the red light (R) is deteriorated by transmitting the coloring layer.

As described, the size of the opening portion 28KB in the sub-pixel 18B is smaller than the size of the opening portions 28KG and 28KR in other sub-pixels 18G and 18R. That is, the light-emitting area on design in the sub-pixel 18B is smaller than the light-emitting areas on design in the other sub-pixels 18G and 18R. The brightness of the light emitted from the sub-pixel 18 is dependent on the light-emitting layer. Therefore, even though the light-emitting area in the sub-pixel 18B is set to be smaller than the light-emitting area in each of the sub-pixels 18G and 18R including the coloring layer, the coloring layer is not disposed but the transparent layer 36T is disposed in the sub-pixel 18B, and thus it is possible to prevent the brightness form being decreased. In other words, even though the current amount in the organic EL element 30B is set to be smaller than other organic EL elements 30G and 30R, it is possible to realize the same brightness. In addition, by decreasing the current amount in the organic EL element 30B, it is possible to decrease the power consumption in the organic EL device 100.

Contact Portion Pixel Electrode

In the embodiment, as the substrate main body 11 of the element substrate 10, a semiconductor substrate formed of silicon is used, for example. The switching transistor 21 and the driving transistor 23 which form the pixel circuit 20 are MOS type transistors. Specifically, as illustrated in FIG. 5, a web unit 10W which is formed by implanting ions into the semiconductor substrate, and an ion implanting unit 10D which is an active layer formed by implanting ions which are different from those of the web unit 10W into the web unit 10W are provided in the substrate main body 11. The web unit 10W serves as a channel of the transistors 21 and 23 in the pixel circuit 20. The ion implanting unit 10D serves as a portion of a source•drain or a wiring of the transistors 21 and 23 in the pixel circuit 20. In addition, FIG. 5 illustrates the ion implanting unit 10D and the web unit 10W which serve as the drain of the driving transistor 23.

The insulating layer 10a is formed to cover the substrate main body 11 in which the ion implanting unit 10D and the web unit 10W are formed. The insulating layer 10a serves as the gate the insulating layer of the transistors 21 and 23 in the pixel circuit 20.

Three interlayer insulating films 10e, 10f, and 10g are sequentially stacked between the insulating layer 10a and the reflective layer 25 on the substrate main body 11. The scanning line 12, the data line 13, and the power line 14 which are described above, or a storage capacitor 22 are provided in a plurality of wiring layers on which the interlayer insulating films 10e, 10f, and 10g are provided.

In the contact portion which causes the driving transistor 23 and the pixel electrode 31 of the organic EL element 30 to be electrically connected to each other, a relay layer is provided on a lower layer of the pixel electrode 31. The relay layer is formed by patterning the reflective layer 25 in an island shape. Specifically, a relay layer 25B is provided on the lower layer of the pixel electrode 31B in the sub-pixel 18B, a relay layer 25G is provided on the lower layer of the pixel electrode 31G in the sub-pixel 18G, and a relay layer 25R is provided on the layer of the pixel electrode 31R in the sub-pixel 18R.

The pixel electrode 31B is formed so as to cover the inside of the contact hole which approaches the relay layer 25B by passing through the first insulating layer 26a, and is electrically connected to the relay layer 25B. The relay layer 25B is formed of a conductive member which embeds the contact hole approaching the drain (the ion implanting unit 10D) of the driving transistor 23 by passing through the interlayer insulating films 10e, 10f, 10g, and the insulating layer 10a, and is electrically connected to the driving transistor 23.

The pixel electrode 31G is formed so as to cover the inside of the contact hole which approaches the relay layer 25G by passing through the first insulating layer 26a and the second insulating layer 26b, and is electrically connected to the relay layer 25G. The pixel electrode 31R is formed so as to cover the inside of the contact hole which approaches the relay layer 25R by passing through the first insulating layer 26a and the second insulating layer 26b, and the third insulating layer 26c, and is electrically connected to the relay layer 25R.

Each of the relay layer 25G and the relay layer 25R is also formed of a conductive member which embeds the contact hole approaching the drain (the ion implanting unit 10D) of the driving transistor 23 by passing through the interlayer insulating films 10e, 10f, and 10g, and the insulating layer 10a, and is electrically connected to the driving transistor 23.

In the contact portion 31CB of the pixel electrode 31B, the contact portion 31CG of the pixel electrode 31G, and the contact portion 31CR of the pixel electrode 31R, which are formed as described above, irregularities are generated in a portion of the transparent layer 26, in which the contact hole is formed. The insulating layer 28 is formed so as to cover the contact portions 31CB, 31CG, and 31CR. That is, the insulating layer 28 and the light-emitting function layer 32 are present between the contact portions 31CB, 31CG, and 31CR, and the counter electrode 33. It is difficult to inject the hole to the light-emitting function layer 32 from a portion of the pixel electrodes 31B, 31G, and 31CR which include the contact portions 31CB, 31CG, and 31CR which are covered with the insulating layer 28, and thus basically, the light emission does not occur in a portion in which the contact portions 31CB, 31CG, and 31CR are provided.

Next, in the organic EL device 100, a structure of the sub-pixel 18 for efficiently extracting the display light from the protective substrate 40 side will be described with reference to FIG. 6 to FIG. 8.

Figure 6:
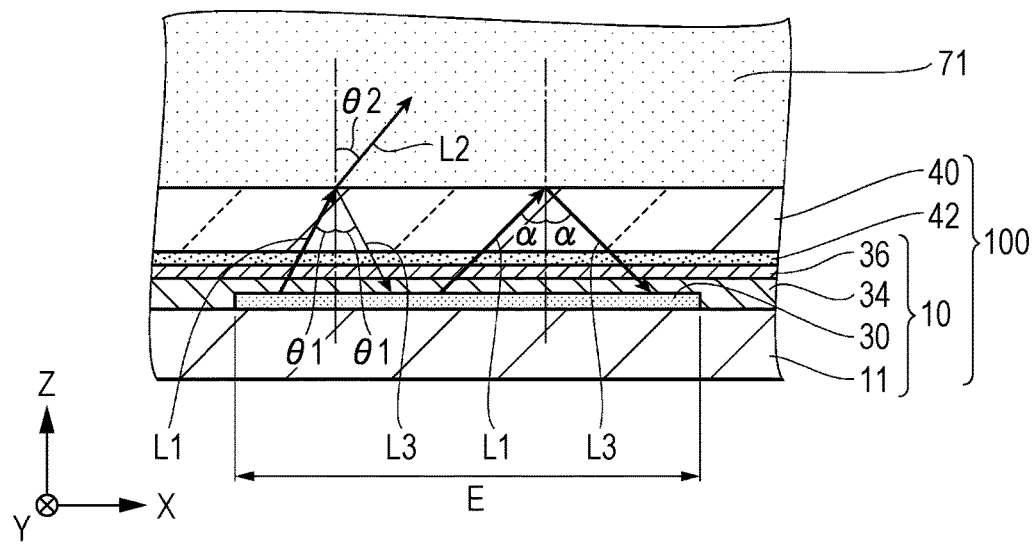
FIG. 6 is a sectional view schematically illustrating the organic EL device taken along line VI-VI in FIG. 1.
Figure 7:
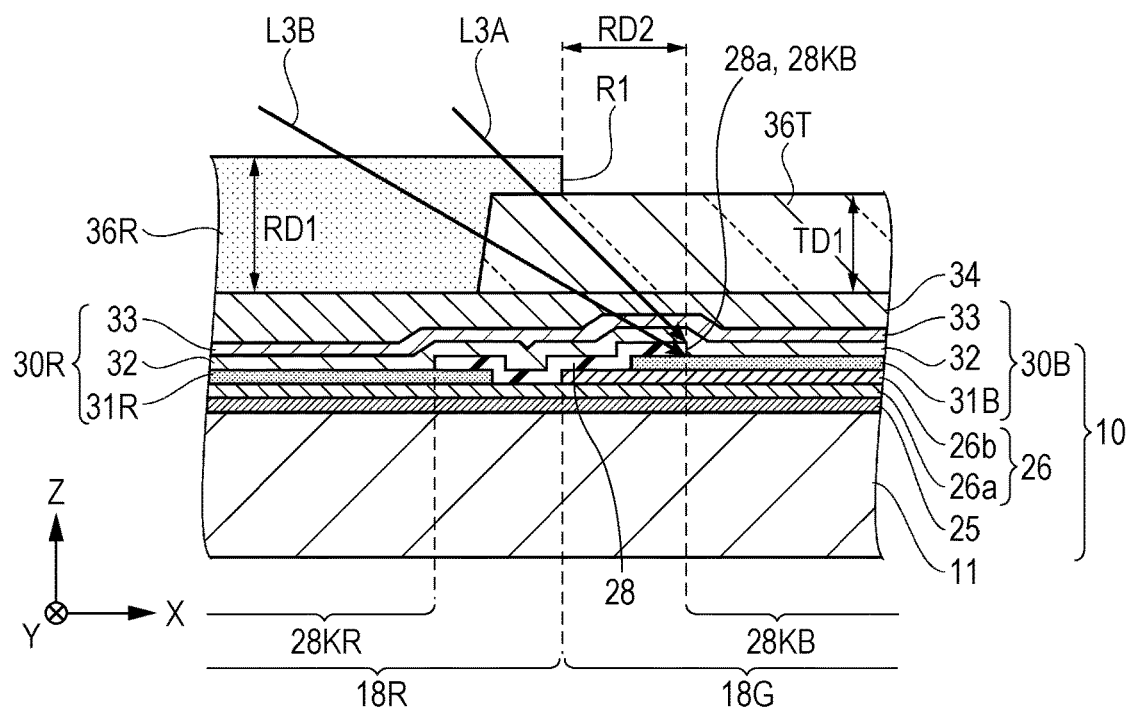
FIG. 7 is a sectional view illustrating a structure of an element substrate in a boundary of the sub-pixels which are adjacent to each other.
Figure 8:
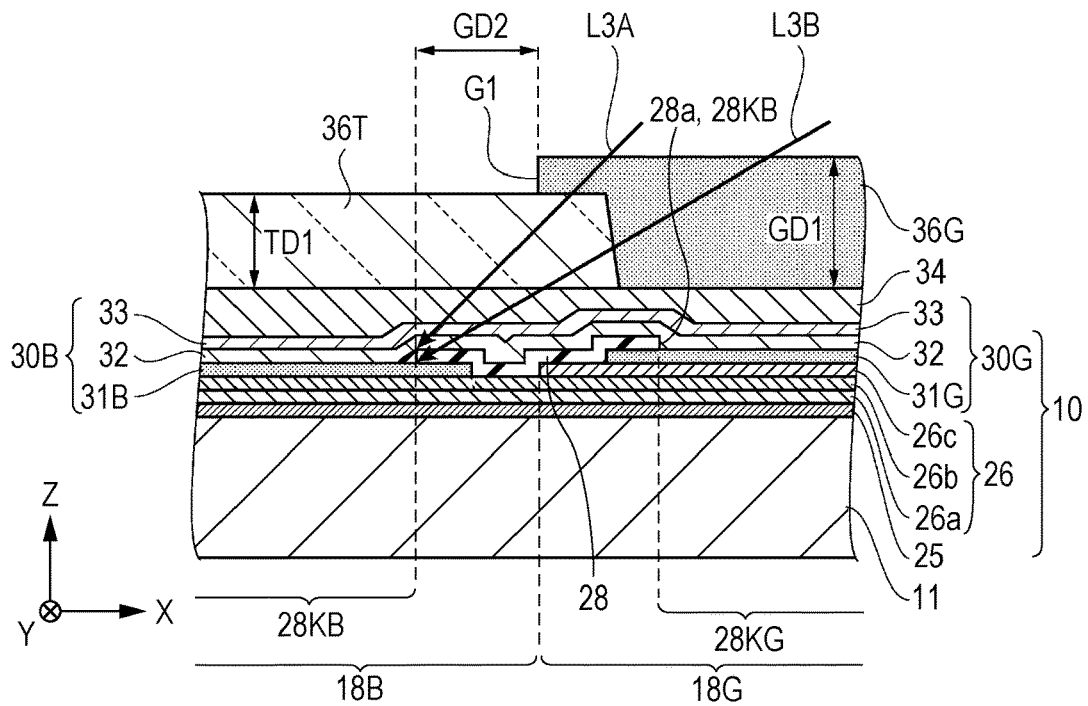
FIG. 8 is a sectional view illustrating the structure of the element substrate in the boundary of the sub-pixels which are adjacent to each other.

FIG. 6 is a sectional view schematically illustrating the organic EL device taken along line VI-VI in FIG. 1, and FIG. 7 and FIG. 8 are sectional views illustrating a structure of an element substrate in a boundary of the sub-pixels which are adjacent to each other. Specifically, FIG. 7 is a sectional view illustrating a structure of the element substrate 10 in the boundary between the sub-pixel 18R and the sub-pixel 18B, and FIG. 8 is a sectional view illustrating a structure of the element substrate 10 in the boundary between the sub-pixel 18B and the sub-pixel 18G.

Meanwhile, FIG. 6 is a sectional view illustrating a simplified structure of the organic EL device 100, and among the component elements of the element substrate 10, the organic EL element 30, the sealing layer 34, and the color filter 36 are illustrated, and the illustration of other component elements of the element substrate 10 is omitted. FIG. 7 and FIG. 8 illustrate the enlarged element substrate 10, and the illustration of the filler 42 and the protective substrate 40 is omitted.

As illustrated in FIG. 6, the light L1 which is emitted from the organic EL element 30 is mostly emitted as light L2 (refracted light) to an atmosphere 71 side from the protective substrate 40 due to a difference of a refractive index between the protective substrate 40 and the atmosphere 71. Similarly, the light L1 which is emitted from the organic EL element 30 is partially reflected on an interface between the protective substrate 40 and the atmosphere 71, and is emitted as light L3 (reflected light) to the element substrate 10 side due to a difference of a refractive index between the protective substrate 40 and the atmosphere 71.

When an angle formed by the light L1 and the Z direction is set as θ1, an angle formed by the light L2 and the Z direction is set at θ2, a refractive index of the protective substrate 40 is set at n1, and a refractive index of the atmosphere 71 is set as n2, the following Equation (1) is established by Snell's law.

$$n1 \sin θ1 = n2 \sin θ2 \quad (1)$$

From Equation (1), the angle θ1 which is formed by the light L1 and the Z direction is expressed by the following Equation (2).

$$θ1 = \sin^{-1}((n2 \sin θ2)/n1) \quad (2)$$

A condition that the angle θ2 formed by the light L2 and the Z direction is larger than 90 degrees corresponds to a condition that the light L1 is not emitted to the atmosphere 71 side, that is, a condition that the light L1 is totally reflected on the interface between the protective substrate 40 and the atmosphere 71. That is, the angle θ1 in a case where the angle θ2 is 90 degrees in Equation (2) is a critical angle α at which the light L1 is totally reflected on the interface between the protective substrate 40 and the atmosphere 71.

When the refractive index n1 (n1≈1.4 to 1.5) of the protective substrate 40, the refractive index n2 (n2 1.0) of the atmosphere 71, and the angle θ2 (90 degrees) in the case where total reflection occurs are substituted into Equation (2), it is possible to obtain the critical angle α at which the light L1 is totally reflected on the interface between the protective substrate 40 and the atmosphere 71. The critical angle α in the embodiment is approximately 45 degrees.

In a case where the angle θ1 formed by the light L1 and the Z direction is the critical angle α (approximately 45 degrees), the light L1 is totally reflected on the interface between the protective substrate 40 and the atmosphere 71, and is emitted as the light L3 (reflected light) to the element substrate 10 side.

That is, in a case where the angle θ1 is smaller than the critical angle α, the light L1 emitted from the organic EL element 30 is mostly emitted as the light L2 to the atmosphere 71 from the protective substrate 40, and the light L3, which is reflected on the interface between the protective substrate 40 and the atmosphere 71, and is emitted to the element substrate 10 side, becomes smaller. That is, it is possible to efficiently extract the light emitted from the organic EL element 30.

On the other hand, in a case where the angle θ1 is the same as or larger than the critical angle α, the light L1 which is emitted from the organic EL element 30 is totally reflected on the interface between the protective substrate 40 and the atmosphere 71, and is emitted to the element substrate 10 side. That is, the intensity of the light L3 becomes stronger and thus it is not possible to efficiently extract the light L1.

Meanwhile, the angle θ1 formed by the light L1 and the Z direction and the angle formed by the light L3 and the Z direction are the same as each other. For example, in a case where the angle θ1 is the critical angle α (45 degrees), the light L3 at which the angle is formed by the Z direction is the critical angle α (45 degrees) is emitted to the element substrate 10 side, and in a case where the angle θ1 is 70 degrees, the light L3 at which the angle formed by the Z direction is 70 degrees is emitted to the element substrate 10 side.

When the light L3 which is reflected on the interface between the protective substrate 40 and the atmosphere 71 is incident on an end portion of the opening portion of the insulating layer 28, the light L3 is reflected on the end portion of the opening portion of the insulating layer 28, and is emitted to the Z direction side, which may adversely affect the display.

Specifically, the luminance of the light L3 in a case where the angle θ1 is the same as the critical angle α or is larger than the critical angle α becomes gradually larger becomes greatly larger than the light L3 in a case where the angle θ1 is smaller than the critical angle α, and thus if the light L3 is incident on the end portion of the opening portion of the insulating layer 28 due to the total reflection, the adverse effect on the display becomes greater.

In the sub-pixel 18G and the sub-pixel 18R, the end portion of the opening portions 28KG and 28KR of the insulating layer 28 overlaps the coloring layers 36G and 36R (refer to FIG. 3). The light L3 reflected on the interface between the protective substrate 40 and the atmosphere 71 transmits inside the coloring layers 36G and 36R, thus the luminance of the light is weakened, and then the light L3 is incident on the end portion of the opening portions 28KG and 28KR of the insulating layer 28, which is less likely to adversely affect the display.

Since the end portion of the opening portion 28KB of the insulating layer 28 overlaps the transparent layer 36T (refer to FIG. 3) in the sub-pixel 18B in which the coloring layer is not provided, as compared with the sub-pixel 18G and the sub-pixel 18R, the light L3 reflected on the interface between the protective substrate 40 and the atmosphere 71 is incident on the end portion of the opening portion 28KB of the insulating layer 28, which may adversely affect the display. As described, in the sub-pixel 18B, if the light L3 at which the angle θ1 is the same as the critical angle α or is larger than the critical angle α is incident on the end portion of the opening portion 28KB of the insulating layer 28 due to the total reflection, the adverse effect on the display becomes greater.

In the embodiment, the thickness of each of the green coloring layer 36G and the red coloring layer 36R is set so as to prevent the light L3 from adversely affecting the display in the sub-pixel 18B. Hereinafter, the details are disposed with reference to FIG. 7 and FIG. 8.

In FIG. 7, in a case where the angle θ1 formed by the Z direction is the critical angle α (approximately 45 degrees), the light reflected on the interface between the protective substrate 40 and the atmosphere 71 is denoted by a reference numeral L3A. In a case where the angle θ1 formed by the Z direction is larger than the critical angle α (approximately 45 degrees), the light reflected on the interface between the protective substrate 40 and the atmosphere 71 is denoted by a reference numeral L3B.

That is, in FIG. 7, an angle formed by light L3A and the Z direction which is approximately 45 degrees is larger than an angle formed by light L3B the Z direction is approximately 45 degrees.

As illustrated in FIG. 7, the transparent layer 36T is disposed on the boundary between the sub-pixel 18R and the sub-pixel 18B, and the coloring layer 36R is disposed on the sub-pixel 18R side so as to cover a portion of the transparent layer 36T. When the light L3A and the light L3B transmits inside the coloring layer 36R so as to be incident on the end portion 28a of the opening portion 28KB, the luminance of the light L3A and the light L3B is weakened, and thus the light which is reflected on the end portion 28a of the opening portion 28KB of the insulating layer 28 is less likely to adversely affect the display.

Since the angle formed by the light L3A and the Z direction is the critical angle α (approximately 45 degrees), in a case where the thickness RD1 (dimension in the Z direction) of the coloring layer 36R is larger than a gap (dimension in the X direction) RD2 between an end portion R1 of the coloring layer 36R and an end portion 28a of the opening portion 28KB, the light L3A reliably transmits through the coloring layer 36R so as to be incident on the end portion 28a of the opening portion 28KB. Further, under the condition that the thickness (dimension in the Z direction) RD1 of the coloring layer 36R is larger than the above-described gap RD2, the light L3B at which the angle formed by the Z direction is larger than the critical angle α (approximately 45 degrees) also reliably transmits through the coloring layer 36R so as to be incident on the end portion 28a of the opening portion 28KB.

Accordingly, the light L3A and the light L3B are absorbed by the coloring layer 36R, and the luminance of the light L3A and the light L3B which are incident on the end portion 28a of the opening portion 28KB of the insulating layer 28 is weakened, and thus the light reflected on the end portion 28a of the opening portion 28KB of the insulating layer 28 is less likely to adversely affect the display.

For this reason, in the embodiment, the thickness of RD1 of the coloring layer 36R is larger than the gap RD2 between the end portion R1 of the coloring layer 36R and the end portion 28a of the opening portion 28KB. That is, the thickness of RD1 of the coloring layer 36R is preferably larger than the gap RD2.

Similarly, as illustrated in FIG. 8, if the thickness (dimension in the Z direction) GD1 of the green coloring layer 36G is set to be larger than a gap (dimension in the X direction) GD2 between an end portion G1 of the coloring layer 36G and the end portion 28a of the opening portion 28KB, the light L3A reliably transmits through the coloring layer 36G so as to be incident on the end portion 28a of the opening portion 28KB. Further, under the condition that the thickness (dimension in the Z direction) GD1 of the coloring layer 36G is larger than the gap (dimension in the X direction) GD2, the light L3B at which the angle formed by the Z direction is larger than the critical angle α (approximately 45 degrees) reliably transmits through the coloring layer 36G so as to be incident on the end portion 28a of the opening portion 28KB.

Accordingly, the light L3A and the light L3B are absorbed by the coloring layer 36G and the luminance of the light L3A and the light L3B which are incident on the end portion 28a of the opening portion 28KB of the insulating layer 28 is weakened, and thus the light reflected on the end portion 28a of the opening portion 28KB of the insulating layer 28 is less likely to adversely affect the display.

For this reason, in the embodiment, the thickness of GD1 of the coloring layer 36G is larger than the gap GD2 between the end portion G1 of the coloring layer 36G and the end portion 28a of the opening portion 28KB. That is, the thickness of GD1 of the coloring layer 36G is preferably larger than the gap GD2.

Method of Manufacturing Organic EL Device

Figure 9:
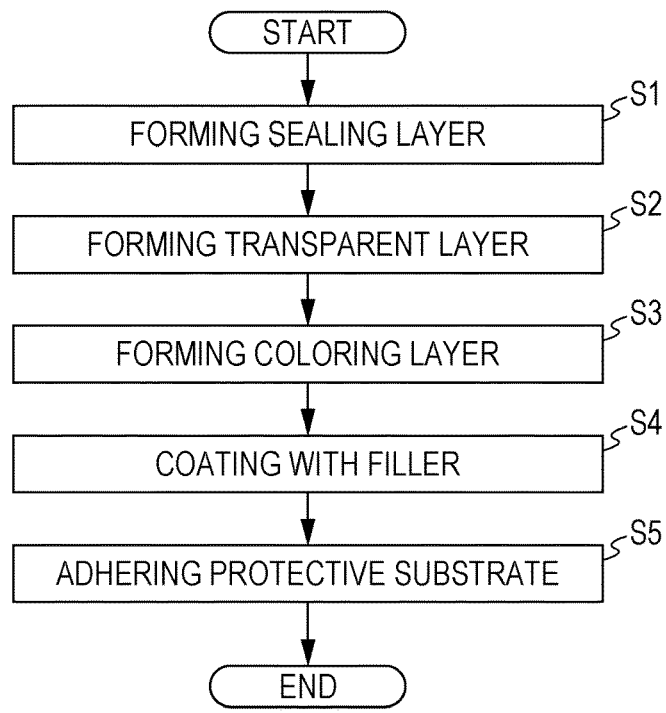
FIG. 9 is a flow chart illustrating a method of manufacturing the organic EL device of the first embodiment.

Next, a method of manufacturing an organic EL device 100 of the embodiment will be described with reference to FIG. 9 to FIG. 16. FIG. 9 is a flow chart illustrating a method of manufacturing the organic EL device of the first embodiment, and FIG. 10 to FIG. 16 are sectional views schematically illustrating the method of manufacturing the organic EL device of the first embodiment. FIG. 10 to FIG. 16 are schematic sectional views corresponding to the schematic sectional view in FIG. 4 which illustrates a structure of the organic EL device.

Note that, in the method of manufacturing the organic EL device 100 of the embodiment, a method of forming the organic EL element 30 on the substrate main body 11 is used in the above-described well-known technology, and thus steps after a step of forming the sealing layer 34 will be described.

As illustrated in FIG. 9, the method of manufacturing the organic EL device 100 of the embodiment includes a sealing layer forming step (step S1), a transparent layer forming step (step S2), a coloring layer forming step (step S3), a filler coating step (step S4), and a protective substrate bonding step (step S5). A step including the transparent layer forming step (step S2) and the coloring layer forming step (step S3) is a color filter forming step.

In the sealing layer forming step in step S1, as illustrated in FIG. 10, the light-emitting function layer 32 and the counter electrode 33 form the organic EL element 30 which is formed over the sub-pixels 18B, 18G, and 18R, that is, the sealing layer 34 for covering the organic EL elements 30B, 30G, and 30R. Specifically, first, silicon oxide is deposited by using a plasma CVD method so as to form the first sealing layer 34*a* for covering the organic EL element 30, for example. Subsequently, the planarization layer 34*b* is obtained by being coated with a solution containing an epoxy resin or an inorganic material (silicon oxide) by using, for example, a spin coating method, and dried (solidified). In addition, for example, silicon oxide is deposited by using a plasma CVD method so as to form the second sealing layer 34*c*. The thickness of each of the first sealing layer 34*a* and the second sealing layer 34*c* which are formed of silicon oxide is in a range of 200 nm to 400 nm, for example. The thickness of the planarization layer 34*b* is in a range of 1 μm to 3 for example.

The planarization layer 34*b* is formed of a flexible material as compared with the first sealing layer 34*a*, and thus cracks are not easily generated, and it is possible to form the thickened planarization layer 34*b*. For example, in a case where a foreign matter which causes defects in the first sealing layer 34*a* is present, the foreign matter is embedded by (coated with) the planarization layer 34*b* so as not to adversely affect the second sealing layer 34*c* which is subsequently formed. That is, even though a defect such as a pin hole and a crack is generated in the first sealing layer 34*a*, the defect is coated with the planarization layer 34*b*, and thus it is less likely to generate the defect such as the pin hole or the crack in the second sealing layer 34*c*.

Meanwhile, the first sealing layer 34*a*, the planarization layer 34*b*, and the second sealing layer 34*c* are formed at a temperature lower than a glass transition point of each layer for forming the light-emitting function layer 32 such that the light-emitting function layer 32 is not thermally deteriorated. Then, the process proceeds to step S2.

In the transparent layer forming step of the step S2, as illustrated in FIG. 11, first, a transparent photosensitive resin layer 36P which is colorless and does not contain any coloring material is formed. As a method of forming the photosensitive resin layer 36P, a method is performed in such a manner that the photosensitive resin layer 36P is formed by being coated with a solution obtained by dissolving a photosensitive acrylic resin having excellent translucency into a solvent by using, for example, a spin coating method, and is dried. Note that, a negative-type photosensitive acrylic resin is used in the embodiment. In addition, the photosensitive resin layer 36P is exposed to the light by using a mask 80 including the light-shielding portion 81. The light-shielding portion 81 is provided with an opening 81*a* corresponding to the sub-pixel 18B, and an opening 81*b* which is opened at a position along the boundary between the sub-pixel 18G and the sub-pixel 18R. The light emitted from the light source passes through the opening 81*a* and the opening 81*b* so as to expose the photosensitive resin layer 36P. Since a light-exposed portion of the photosensitive resin layer 36P is insoluble, for example, as illustrated in FIG. 12, the transparent layer 36T is formed on the sealing layer 34 in the sub-pixel 18B through the development by using a dedicated developer. In addition, the transparent layer 36K is formed at a position along the boundary between the sub-pixel 18G and the sub-pixel 18R. The cross-section of the developed transparent layers 36K and 36T is a trapezoidal shape. The thickness of the photosensitive resin layer 36P on the sealing layer 34, that is, the thickness (height) of each of the transparent layers 36K and 36T is smaller than that of the coloring layers 36G and 36R which are subsequently formed, for example, the thickness is in a range of 0.8 μm to 1.2 μm. In addition, the transparent layers 36K and 36T may be formed of a positive-type photosensitive acrylic resin. Then, the process proceeds to step S3.

Figure 13:
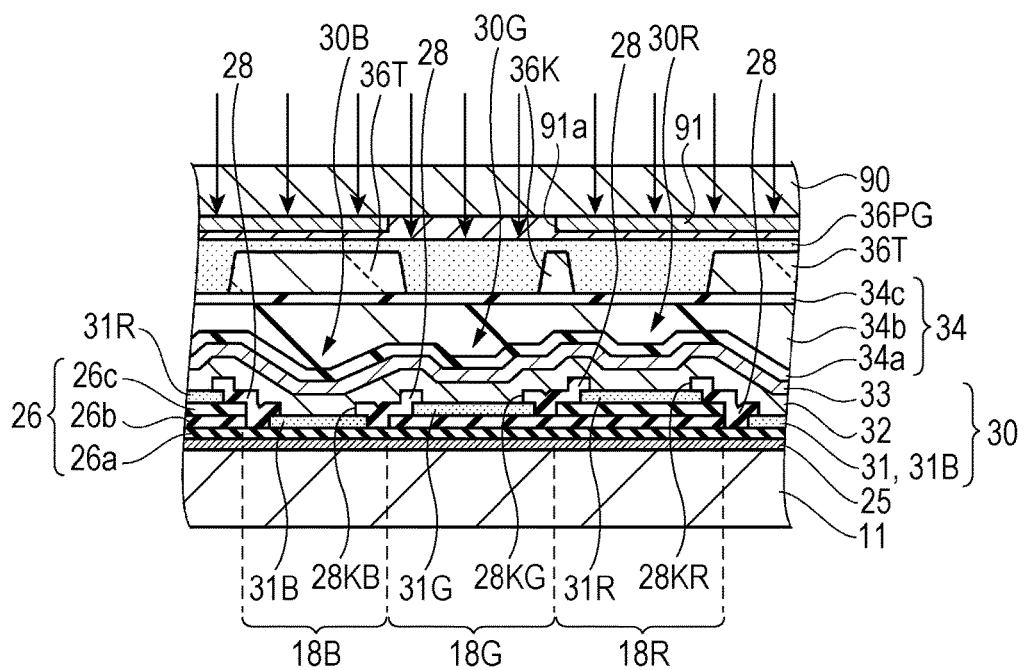
FIG. 13 is a sectional view schematically illustrating the method of manufacturing the organic EL device of the first embodiment.
Figure 14:
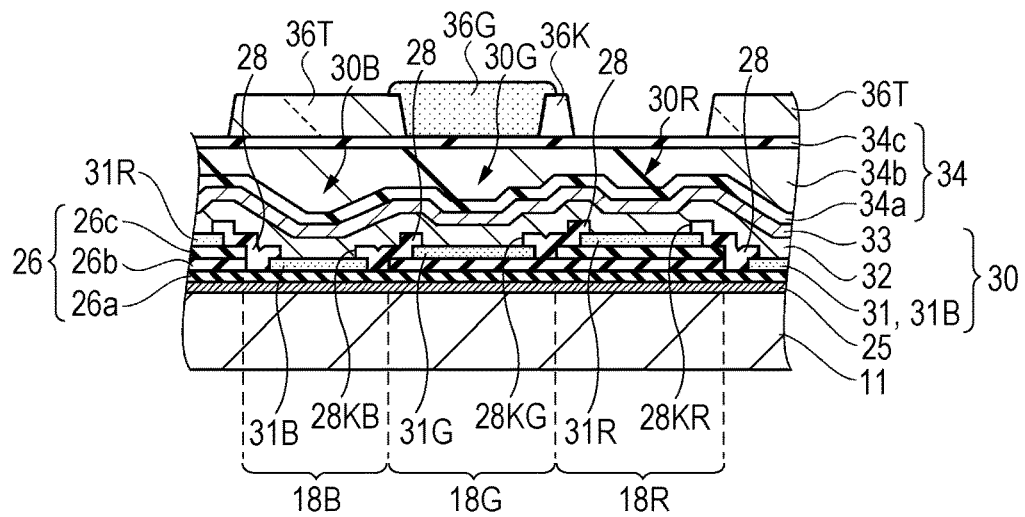
FIG. 14 is a sectional view schematically illustrating the method of manufacturing the organic EL device of the first embodiment.
Figure 15:
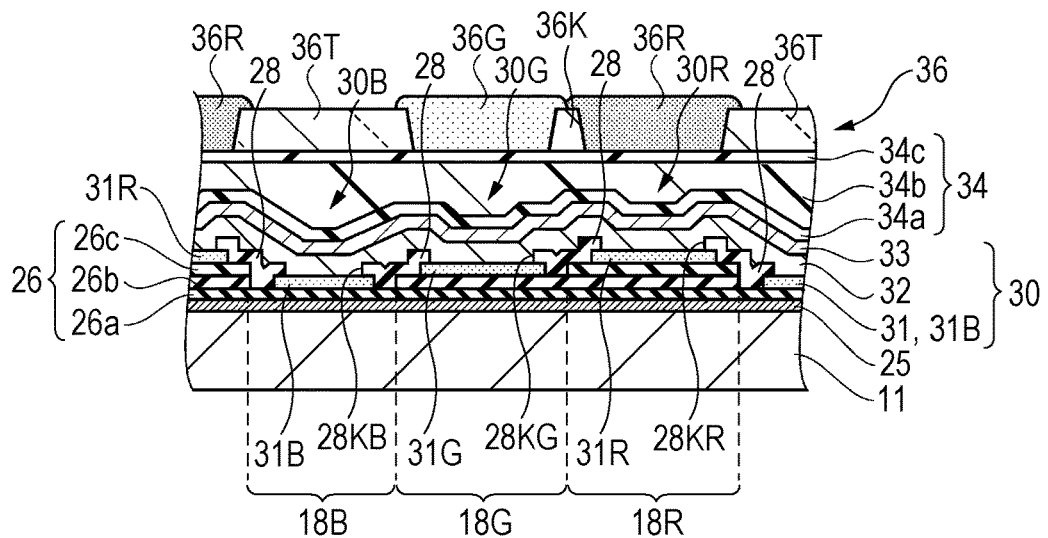
FIG. 15 is a sectional view schematically illustrating the method of manufacturing the organic EL device of the first embodiment.

In the coloring layer forming step of step S3, the coloring layer 36G is formed in the sub-pixel 18G, and the coloring layer 36R is formed in the sub-pixel 18R. Specifically, as illustrated in FIG. 13, first, a photosensitive resin layer 36PG which contains a green coloring material is formed so as to cover the transparent layers 36K and 36T on the sealing layer 34. As a method of forming the photosensitive resin layer 36PG, a method is performed in such a manner that the photosensitive resin layer 36PG is formed by being coated with a solution obtained by dissolving a photosensitive acrylic resin containing the green coloring material into a solvent by using, for example, a spin coating method, and is dried. As described above, a negative-type photosensitive acrylic resin is used in the embodiment. Then, the photosensitive resin layer 36PG is exposed to the light by using a mask 90 including a light-shielding portion 91. The light-shielding portion 91 is provided with an opening 91*a* corresponding to the sub-pixel 18G. The light emitted from the light source passes through the opening 91*a* so as to expose the photosensitive resin layer 36PG. Since a light-exposed portion of the photosensitive resin layer 36PG is insoluble, for example, as illustrated in FIG. 14, the transparent layer 36G is formed on the sealing layer 34 in the sub-pixel 18G through the development by using a dedicated developer. Subsequently, as illustrated in FIG. 15, the coloring layer 36R is formed by using the same method as that of the coloring layer 36G. The thickness of the coloring layers 36G and 36R is in a range of 1.0 to 2.0 μm, for example. With this, the color filter 36 in which the coloring layers 36G and 36R, and the transparent layers 36K and 36T are disposed is formed on the sealing layer 34. In addition, the process proceeds to step S4 and step S5. Meanwhile, the order of forming the coloring layers is not limited as described above, and the coloring layer 36G may be formed after forming the coloring layer 36R.

Figure 16:
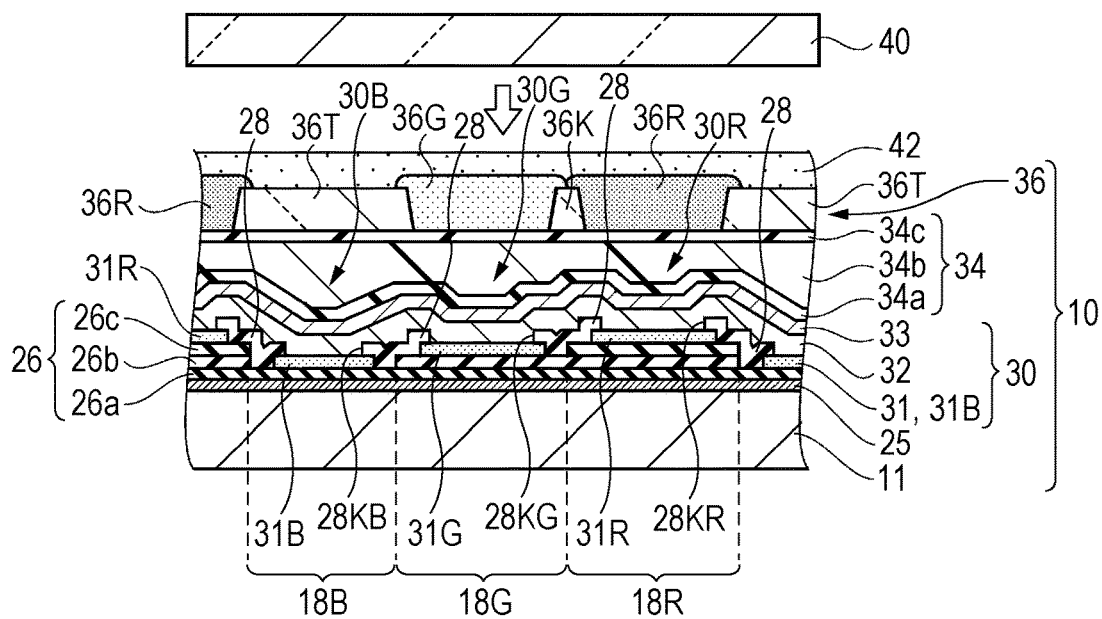
FIG. 16 is a sectional view schematically illustrating the method of manufacturing the organic EL device of the first embodiment.

In the filler coating step of step S4, as illustrated in FIG. 16, the color filters 36 are coated with the filler 42 to be covered. Examples of a coating method of filler 42 include a dispense method of discharging the uncured filler 42 from a nozzle, a spin coating method, and a roll coating method. The filler 42 is formed of an epoxy resin or an acrylic resin which is a thermosetting type and has the light transmissivity after being cured. In addition, in the protective substrate bonding step of step S5, the filler 42 with which the color filters are coated is compressed by the protective substrate 40 and thermally cured such that the element substrate 10 and the protective substrate 40 are bonded to each other.

With this, it is possible to form the organic EL device 100 as illustrated in FIG. 4. Note that, in the color filter forming step, a heat treatment such as post-baking of the developed transparent layers 36K and 36T, and the coloring layers 36G and 36R, and the curing of the thermosetting type filler 42 is at a temperature lower than a glass transition point of each layer for forming the light-emitting function layer 32

According to the organic EL device 100 and the method of manufacturing the organic EL device 100 of the first embodiment, the following effects can be obtained.

(1) On the sealing layer 34, the coloring layer 36G (the coloring layer 36R) is formed in the sub-pixel 18G (the sub-pixel 18R), and the transparent layer 36T is formed in the sub-pixel 18B without forming the coloring layer. Accordingly, even though the light-emitting area in the sub-pixel 18B is smaller than other sub-pixels 18G and 18R, it is possible to prevent the luminance from being weakened in the sub-pixel 18B, and is possible to provide or manufacture the organic EL device 100 having a desired luminance.

In addition, when the light-emitting area in the sub-pixel 18B is set to be smaller than other sub-pixels 18G and 18R, as compared with a case where the light-emitting areas are the same size as each other, the size of the pixel 19 which is a display unit per unit area can be set to be small, and thus it is possible to realize the pixel 19 with high definition while securing a desired luminance.

(2) The transparent layers 36K and 36T, and the coloring layers 36G and 36R are formed by exposing and developing the photosensitive resin layer containing the photosensitive acrylic resin as a main component. In addition, the coloring layers 36G and 36R are formed after forming the transparent layers 36K and 36T. The transparent layers 36K and 36T which do not contain the coloring material can be formed to have high-definition with high positional accuracy as compared with the coloring layers 36G and 36R which contain the coloring material. Accordingly, by forming the transparent layers 36K and 36T first, and then the coloring layers 36G and 36R, based on the transparent layers 36K and 36T, it is possible to form the coloring layers 36G and 36R with high positional accuracy. In addition, it is easy to secure the thickness of the coloring layers 36G and 36R which are subsequently formed. That is, in the sub-pixels 18G and 18R, it is possible to cause the light emitted from the organic EL element 30 to reliably transmit through the coloring layers 36G and 36R and to be emitted. For this reason, it is possible to provide or manufacture the organic EL device 100 which enables a highly attractive color display.

(3) The protective substrate 40 is bonded to the element substrate 10 via the filler 42, and thus it is possible to prevent the color filter 36 or the organic EL element 30 in the element substrate 10 from being damaged. In addition, the organic EL element 30 is protected by not only the sealing layer 34 but also the protective substrate 40, and thus it is possible to prevent oxygen and moisture from the outside from entering thereinto so as to reduce the effect on the light-emitting properties and emission lifetime of the organic EL element 30. That is, it is possible to provide or manufacture the organic EL device 100 having the stable light-emitting properties and long emission lifetime.

Second Embodiment

Organic EL Device and Method of Manufacturing the Same

Figure 17:
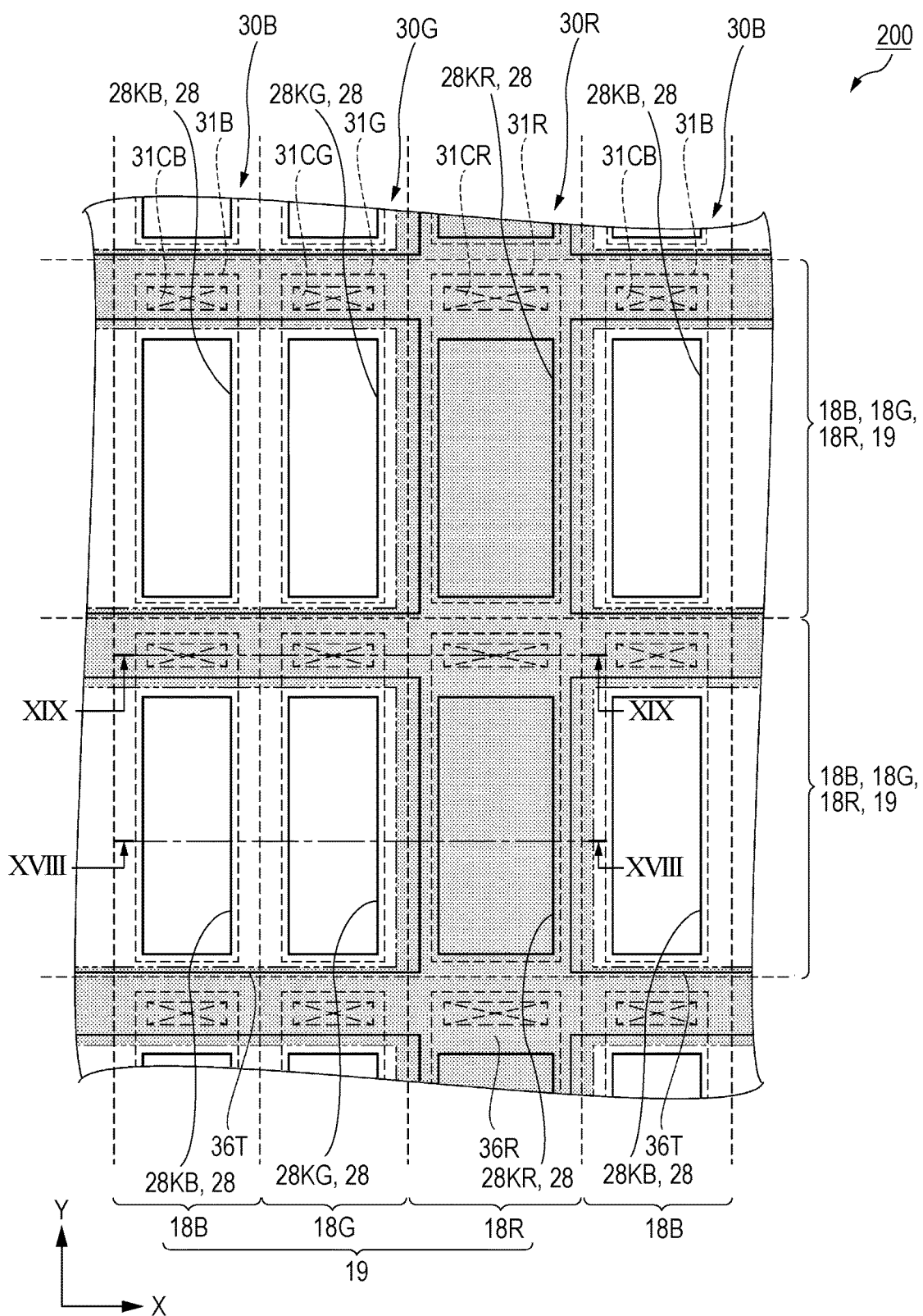
FIG. 17 is a schematic plan view illustrating disposition of pixel electrodes and color filters in an organic EL device of a second embodiment.
Figure 18:
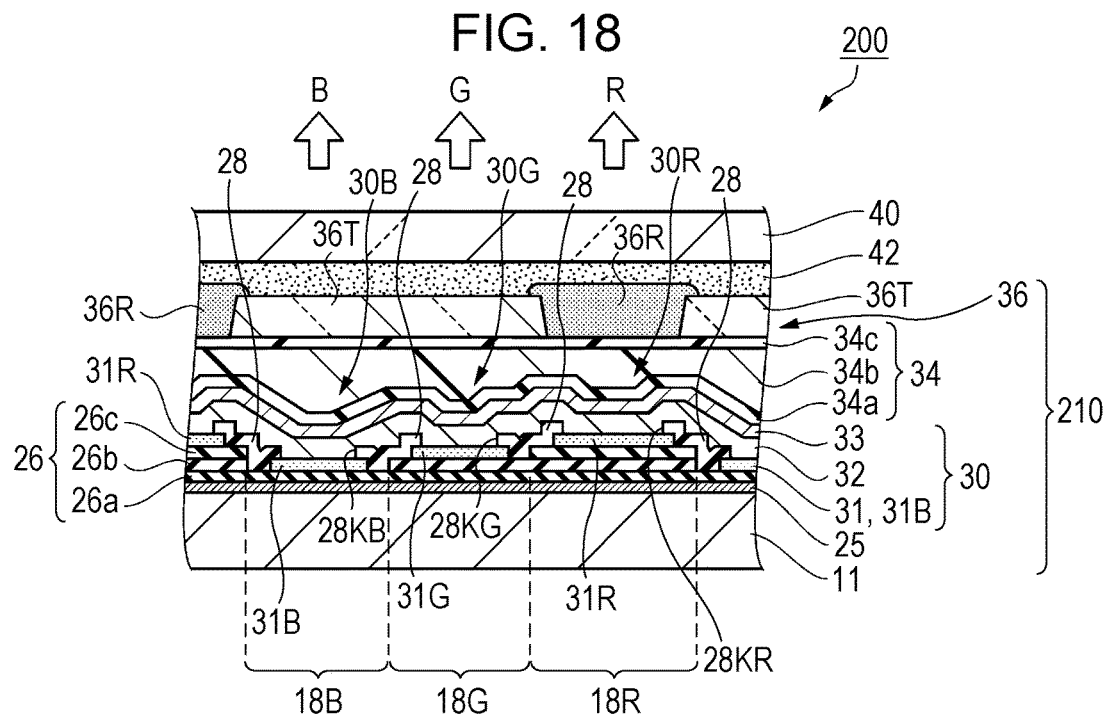
FIG. 18 is a sectional view schematically illustrating a structure of a sub-pixel taken along line XVIII-XVIII in FIG. 17.
Figure 19:
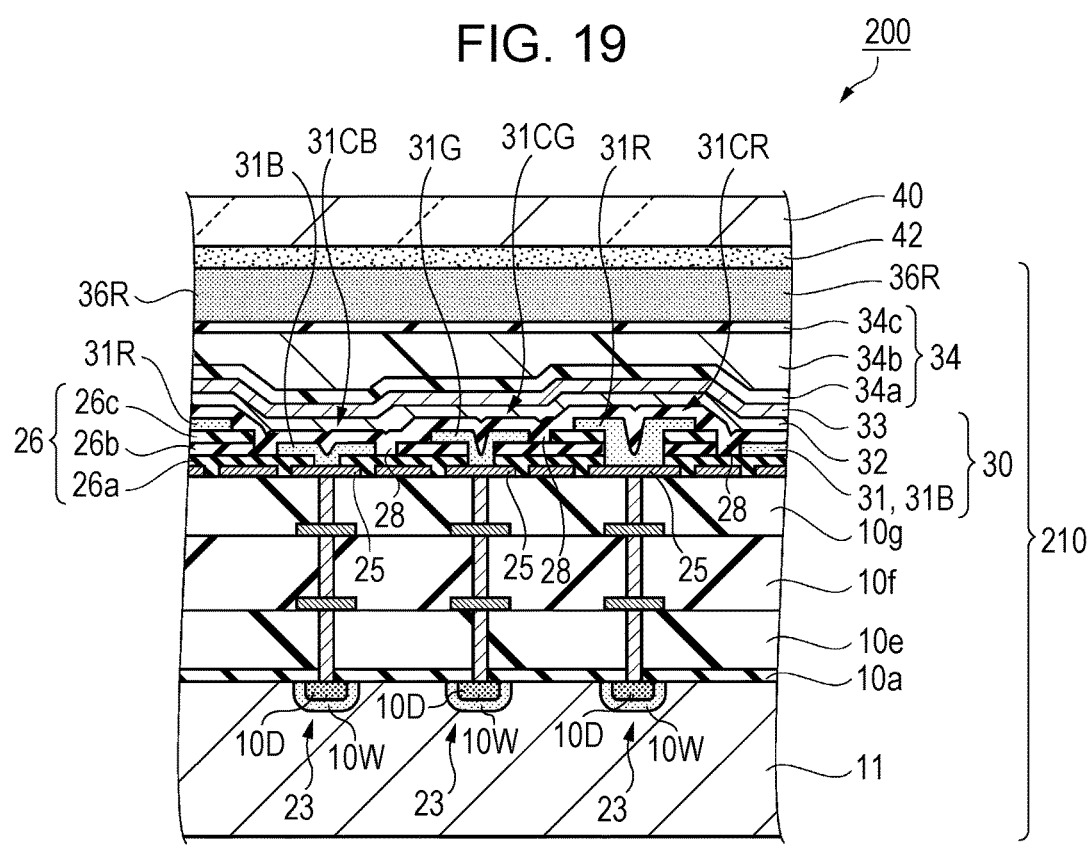
FIG. 19 is a sectional view schematically illustrating a structure of a contact portion in a pixel electrode taken along line XIX-XIX in FIG. 17.

Next, the organic EL device of the second embodiment will be described with reference to FIG. 17 to FIG. 19. FIG. 17 is a schematic plan view illustrating disposition of pixel electrodes and color filters in the organic EL device of the second embodiment, FIG. 18 is a sectional view schematically illustrating a structure of the sub-pixel taken along line XVIII-XVIII in FIG. 17, and FIG. 19 is a sectional view schematically illustrating a structure of a contact portion in a sub-pixel taken along line XIX-XIX in FIG. 17. An organic EL device 200 of the second embodiment is obtained by differentiating the configuration of, particularly, the color filter 36 in the sub-pixel 18 of the organic EL device 100 of the above-described first embodiment, and the same components as those in the organic EL device 100 are denoted by the same reference numerals and the detailed description thereof will be omitted.

As illustrated in FIG. 17, the organic EL device 200 of the embodiment includes the plurality of sub-pixels 18 which are arranged in a matrix shape in the X direction and the Y direction. The pixel electrode 31 of the organic EL element 30 is disposed in each of the sub-pixels 18. Specifically, the pixel electrode 31B of the organic EL element 30B which is disposed in the sub-pixel 18B, the pixel electrode 31G of the organic EL element 30G which is disposed in the sub-pixel 18G, and the pixel electrode 31R of the organic EL element 30R which is disposed in the sub-pixel 18R are arranged in the X direction. Each of the pixel electrodes 31B, 31G, and 31R is formed into a rectangular shape in a planar view, and is disposed along the Y direction of the longitudinal direction. In the embodiment, the length of each of the pixel electrodes 31B, 31G, and 31R in the Y direction is the same. In addition, the length of each of the pixel electrodes 31B and 31G in the X direction is shorter than that of the pixel electrodes 31R in the X direction.

A contact portion in which the pixel electrode 31 is electrically connected to the aforementioned driving transistor 23 is provided on one end side (the upper end side in FIG. 17) of each of the pixel electrodes 31 in the Y direction. Specifically, a contact portion 31CB is provided in the pixel electrode 31B, a contact portion 31CG is provided in the pixel electrode 31G, and a contact portion 31CR is provided in the pixel electrode 31R.

The pixel electrodes 31B, 31G, and 31R are covered with the insulating layer 28 so as to be insulated from each other. Specifically, the insulating layer 28 is provided so as to cover each of circumferential edge portions including the contact portions 31CB, 31CG, and 31CR in the pixel electrodes 31B, 31G, and 31R. With this, in each of the pixel electrodes 31B, 31G, and 31R, opening portions 28KB, 28KG, and 28KB which are formed into a rectangular shape in a planar view are formed on the pixel electrodes 31B, 31G, and 31R, except for the contact portions 31CB, 31CG, and 31CR. Note that, the shape of the opening portions 28KB, 28KG, and 28KR is not limited to the rectangular shape.

In the embodiment, the length of each of the opening portions 28KB, 28KG, and 28KR in the Y direction is the same, the length of each of the opening portions 28KB and 28KG in the X direction is shorter than that of opening portion 28KR in the X direction. That is, the light-emitting area in each of the sub-pixels 18B and 18G is smaller than that of the light-emitting layer in the sub-pixel 18R.

The color filter 36 which are disposed in such sub-pixels 18B, 18G, and 18R are configured to include a red (R)

coloring layer 36R, and a transparent layer 36T which is colorless and transparent. Specifically, the transparent layer 36T is disposed over the sub-pixel 18B and the sub-pixel 18G which are adjacent to each other in the X direction, and the coloring layers 36R are disposed with respect to the plurality of sub-pixels 18R which are arranged in the Y direction. That is, the transparent layer 36T is disposed in an island shape so as to overlap the pixel electrode 31B (opening portion 28KB) and the pixel electrode 31G (opening portion 28KG) which are adjacent to each other in the X direction. In addition, the transparent layer 36T is disposed in an island shape so as not to cover the contact portion 31CB and the contact portion 31CG. The coloring layers 36R are disposed in a stripe shape so as to extend in the Y direction such that the coloring layers 36R overlap the pixel electrodes 31R (opening portions 28KR) arranged in the Y direction, and cover the contact portions 31CB, 31CG, and 31CR arranged in the X direction.

In the boundary between the sub-pixel 18B and the sub-pixel 18G which are adjacent to each other in the X direction with respect to the sub-pixel 18R, the transparent layer 36T and the coloring layer 36R are disposed so as to be overlapped with each other.

As illustrated in FIG. 18, the organic EL device 200 employs a top emission type in which the element substrate 210 and the protective substrate 40 which are disposed so as to face each other via the filler 42 are provided, and the light emitted from the sub-pixel 18 of element substrate 210 is emitted from the protective substrate 40 side.

A reflective layer 25, a transparent layer 26, an organic EL element 30, a sealing layer 34, and a color filter 36 are sequentially formed on the substrate main body 11 of the element substrate 210. Similar to the organic EL device 100 of the first embodiment, the organic EL device 200 has an optical resonator structure in the sub-pixel 18. That is, when the thickness of the transparent layer 26 between the reflective layer 25 and the pixel electrode 31 is differentiated for each of the sub-pixels 18B, 18G, and 18R, blue light (B) having a peak wavelength of 470 nm is emitted from the sub-pixel 18B, green light (G) having a peak wavelength of 540 nm is emitted from the sub-pixel 18G, and red light (R) having a peak wavelength of 610 nm is emitted from the sub-pixel 18R.

The transparent layer 36T is disposed over the sub-pixel 18B and the sub-pixel 18G which are adjacent to each other on the sealing layer 34 which covers the organic EL element 30. In addition, the coloring layer 36R is disposed corresponding to the sub-pixel 18R.

In addition, as illustrated in FIG. 19, the coloring layer 36R is disposed over the contact portions 31CB, 31CG, and 31CR on the sealing layer 34 which covers the contact portions 31CB, 31CG, and 31CR which cause each of the pixel electrodes 31B, 31G, and 31R, and the driving transistor 23 are electrically connected to each other.

A method of manufacturing the organic EL device 200 including the sub-pixel 18 which is provided with such a color filter 36 is basically the same method of manufacturing the organic EL device 100 of the first embodiment. Here, in the transparent layer forming step of step S2, the transparent layer 36T is formed over the sub-pixel 18B and the sub-pixel 18G which are adjacent to each other in the X direction. In the coloring layer forming step of step S3, the coloring layer 36R is formed with respect to the sub-pixel 18R such that the coloring layer 36R covers the contact portions 31CB, 31CG, and 31CR. The same is true for other steps.

According to the organic EL device 200 of the second embodiment and the method of manufacturing the same, the following effects can be obtained in addition to the above-described effects (2) and (3) of the first embodiment.

(4) On the sealing layer 34, the coloring layer 36R is formed in the sub-pixel 18R, and the transparent layer 36T is formed in the sub-pixels 18B and 18G without forming the coloring layer. Accordingly, even though the light-emitting area in each of the sub-pixels 18B and 18G are smaller than that of the sub-pixel 18R, it is possible to prevent the luminance from being weakened in the sub-pixels 18B and 18G, and is possible to provide or manufacture the organic EL device 200 having a desired luminance.

(5) When the transparent layer 36T is disposed in the sub-pixels 18B and 18G having a small light-emitting area, it is possible to more suppress the current amount flowing into the organic EL elements 30B and 30G than that flowing into the organic EL element 30R while securing the luminance in the sub-pixels 18B and 18G. Accordingly, it is possible to provide or manufacture the organic EL device 200 in which the power consumption is more reduced than that of the organic EL device 100 of the first embodiment.

(6) As described in the first embodiment, the contact portions 31CB, 31CG, and 31CR are covered with the insulating layer 28; however, the surface thereof has irregularities thereon. If the light is incident on such contact portions 31CB, 31CG, and 31CR from the light-emitting area, the light is easily scattered. Even though the light is scattered as described above, the coloring layer 36R is disposed on the upper layer of the contact portions 31CB, 31CG, and 31CR in the second embodiment, and thus it is possible to absorb the scattered light by the coloring layer 36R. That is, it is possible to realize highly attractive color display by reducing the effect of the scattered light in the contact portions 31CB, 31CG, and 31CR. Particularly, it is preferable that the red coloring layer 36R (or the blue coloring layer 36B) which is capable of absorbing the green light having high visibility is disposed on the upper layer of the contact portions 31CB, 31CG, and 31CR.

Third Embodiment

Organic EL Device and Method of Manufacturing the Same

Figure 20:
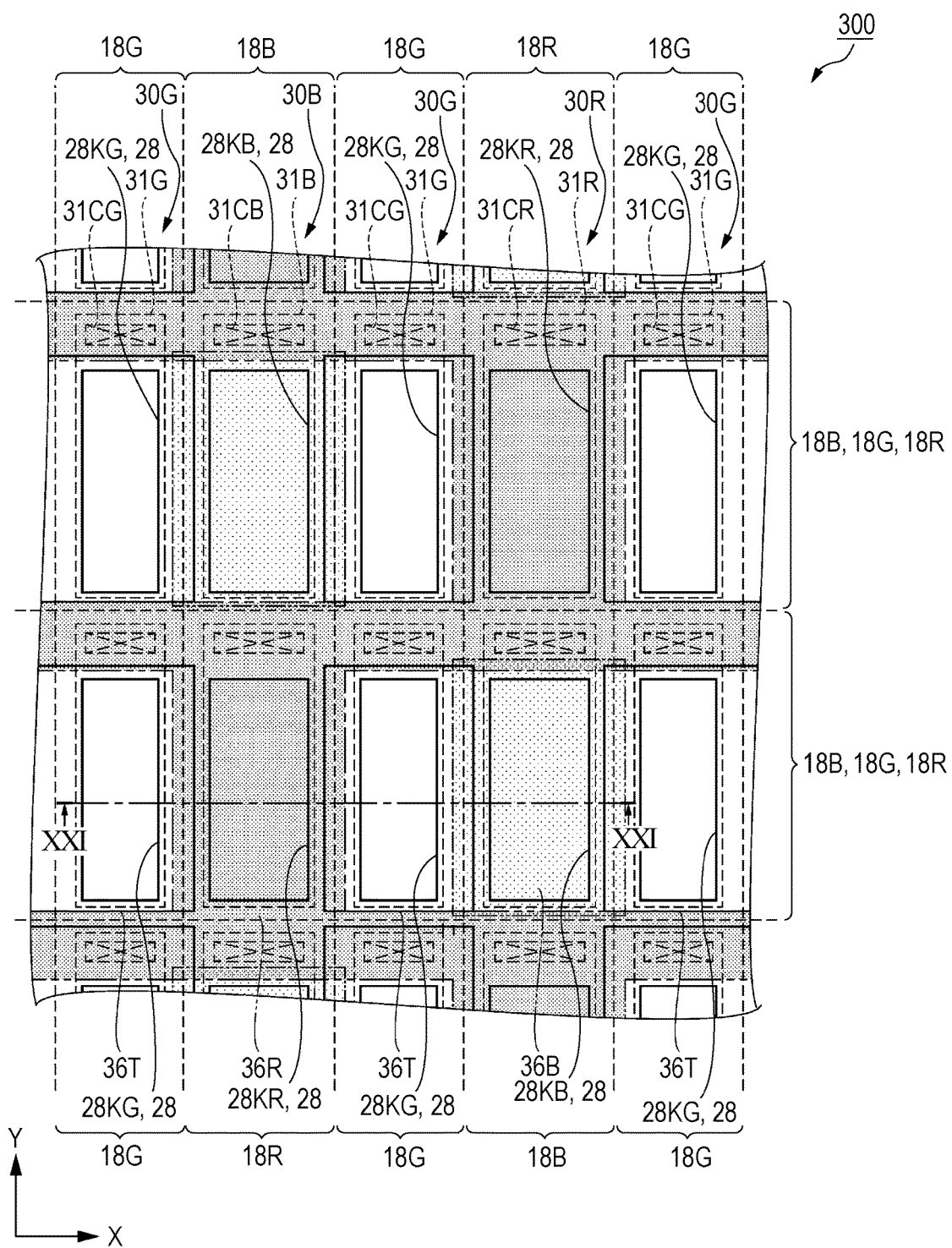
FIG. 20 is a schematic plan view illustrating disposition of pixel electrodes and color filters in an organic EL device of a third embodiment.
Figure 21:
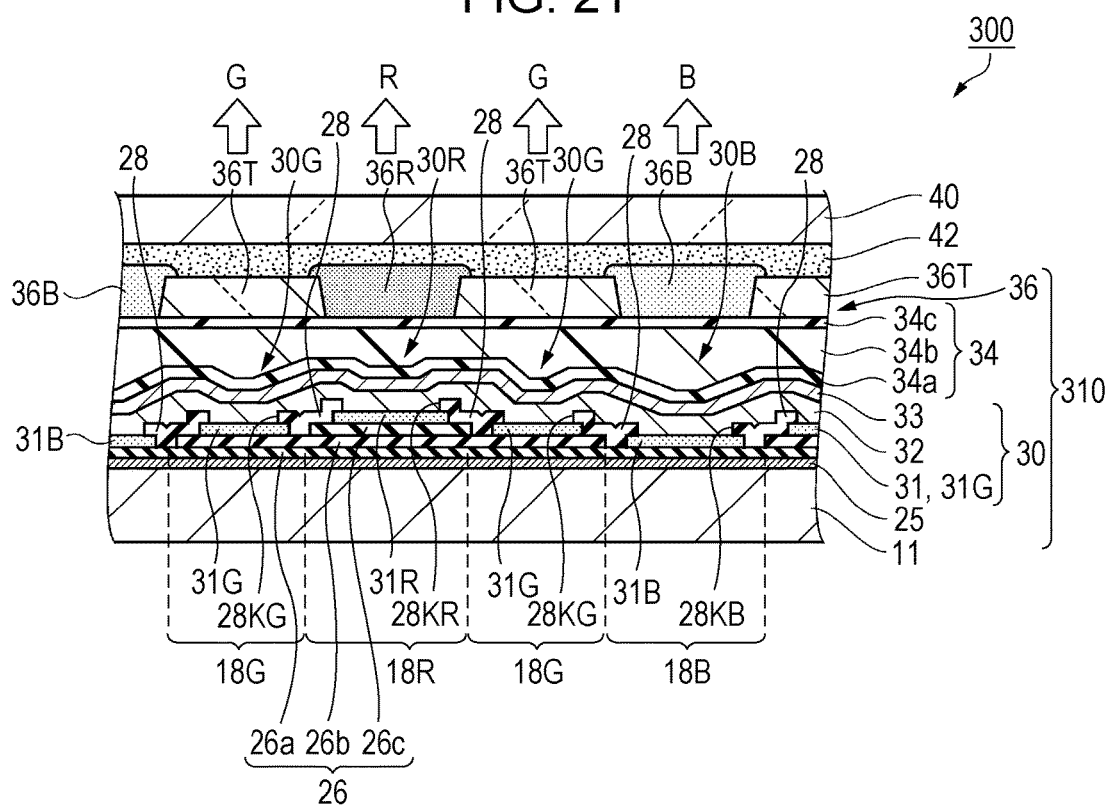
FIG. 21 is a sectional view schematically illustrating a structure of a sub-pixel taken along line XXI-XXI in FIG. 20.

Next, the organic EL device of the third embodiment will be described with reference to FIG. 20 and FIG. 21. FIG. 20 is a schematic plan view illustrating disposition of pixel electrodes and color filters in the organic EL device of the third embodiment, and FIG. 21 is a sectional view schematically illustrating a structure of the sub-pixel taken along line XXI-XXI in FIG. 20. An organic EL device 300 of the third embodiment is obtained by differentiating the configuration of, particularly, the color filter 36 in the sub-pixel 18 of the organic EL device 100 of the above-described first embodiment, and the same components as those in the organic EL device 100 are denoted by the same reference numerals and the detailed description thereof will be omitted.

As illustrated in FIG. 20, the organic EL device 300 of the embodiment includes the plurality of sub-pixels 18 which are arranged in a matrix shape in the X direction and the Y direction. The plurality of sub-pixels 18G are arranged in Y direction, and the sub-pixel 18B and the sub-pixel 18R are alternatively arranged parallel with the sub-pixel 18G in the Y direction. The sub-pixel 18G is disposed to adjacent to both side of the sub-pixel 18B in the sub-pixel 18B, and similarly, the sub-pixel 18G is disposed to adjacent to both side of the sub-pixel 18R in X direction. In the organic EL device 300, a display unit is formed of two of the sub-pixels 18G which are arranged in the Y direction, and the sub-pixel 18B and the sub-pixel 18R which are parallel to the sub-pixel 18G, which realize the color display. Such a disposition of the sub-pixels 18 is referred to as a PenTile type disposition. It is possible to realize the artificial display with high-definition by increasing the number of the green sub-pixels 18G having high visibility more than the number of other sub-pixels 18B and 18R in the display unit.

The pixel electrode 31 of the organic EL element 30 is disposed in each of the sub-pixels 18. Specifically, the pixel electrode 31B of the organic EL element 30B which is disposed in the sub-pixel 18B, the pixel electrode 31G of the organic EL element 30G which is disposed in the sub-pixel 18G, and the pixel electrode 31R of the organic EL element 30R which is disposed in the sub-pixel 18R are arranged in the X direction. Each of the pixel electrodes 31B, 31G, and 31R is formed into a rectangular shape in a planar view, and is disposed along the Y direction of the longitudinal direction. In the embodiment, the length of each of the pixel electrodes 31B, 31G, and 31R in the Y direction is the same. In addition, the length of the pixel electrode 31G in the X direction is shorter than those of the pixel electrodes 31B and 31R in the X direction.

A contact portion in which the pixel electrode 31 is electrically connected to the aforementioned driving transistor 23 is provided on one end side (the upper end side in FIG. 20) of each of the pixel electrodes 31 in the Y direction. Specifically, a contact portion 31CB is provided in the pixel electrode 31B, a contact portion 31CG is provided in the pixel electrode 31G, and a contact portion 31CR is provided in the pixel electrode 31R.

The pixel electrodes 31B, 31G, and 31R are covered with the insulating layer 28 so as to be insulated from each other. Specifically, the insulating layer 28 is provided so as to cover each of circumferential edge portions including the contact portions 31CB, 31CG, and 31CR in the pixel electrodes 31B, 31G, and 31R. With this, in each of the pixel electrodes 31B, 31G, and 31R, opening portions 28KB, 28KG, and 28KR which are formed into a rectangular shape in a planar view are formed on the pixel electrodes 31B, 31G, and 31R, except for the contact portions 31CB, 31CG, and 31CR. Note that, the shape of the opening portions 28KB, 28KG, and 28KR is not limited to the rectangular shape.

In the embodiment, the length of each of the opening portions 28KB, 28KG, and 28KR in the Y direction is the same, the length of the opening portion 28KG in the X direction is shorter than the thickness of the each of the opening portions 28KB and 28KR in the X direction. The thickness of the opening portion 28KB and the thickness of the opening portion 28KR in the X direction are the same as each other. That is, the light-emitting area in the sub-pixel 18G is smaller than the light-emitting area in each of the sub-pixels 18B and 18R. The light-emitting area in each of the sub-pixel 18B and the sub-pixel 18R are the same as each other.

The color filter 36 which are disposed in such sub-pixels 18B, 18G, and 18R are configured to include a blue (B) coloring layer 36B, a red (R) coloring layer 36R, and a transparent layer 36T which is colorless and transparent. Specifically, the transparent layer 36T which is disposed in the sub-pixel 18G, the coloring layer 36B which is disposed with respect to the sub-pixel 18B, and the coloring layer 36R which is disposed with respect to the sub-pixel 18R are arranged in the Y direction. The transparent layer 36T is disposed in an island shape so as to overlap the pixel electrode 31G (opening portion 28KG). In addition, the transparent layer 36T is disposed in an island shape so as not to overlap the contact portion 31CG. The coloring layer 36B is disposed so as to overlap the pixel electrode 31B (opening portion 28KB). In addition, the coloring layer 36B is disposed in an island shape so as not to cover the contact portion 31CB. The coloring layer 36R is disposed so as to overlap the pixel electrode 31R (opening portions 28KR) arranged in the Y direction, and to cover the contact portions 31CB, 31CG, and 31CR arranged in the X direction.

In the boundary between the sub-pixel 18B and the sub-pixel 18R which are adjacent to each other in the X direction with respect to the sub-pixel 18G, one end portion of the transparent layer 36T overlaps the coloring layer 36B, and the transparent layer 36T and the coloring layer 36R are disposed so as to be overlapped with each other.

As illustrated in FIG. 21, the organic EL device 300 employs a top emission type in which the element substrate 310 and the protective substrate 40 which are disposed so as to face each other via the filler 42 are provided, and the light emitted from the sub-pixel 18 of element substrate 310 is emitted from the protective substrate 40 side.

A reflective layer 25, a transparent layer 26, an organic EL element 30, a sealing layer 34, and a color filter 36 are sequentially formed on the substrate main body 11 of the element substrate 310. Similar to the organic EL device 100 of the first embodiment, the organic EL device 300 has an optical resonator structure in the sub-pixel 18. That is, when the thickness of the transparent layer 26 between the reflective layer 25 and the pixel electrode 31 is differentiated for each of the sub-pixels 18B, 18G, and 18R, blue light (B) having a peak wavelength of 470 nm is emitted from the sub-pixel 18B, green light (G) having a peak wavelength of 540 nm is emitted from the sub-pixel 18G, and red light (R) having a peak wavelength of 610 nm is emitted from the sub-pixel 18R.

The transparent layer 36T is disposed corresponding to the sub-pixel 18G the transparent layer 36T on the sealing layer 34 which covers the organic EL element 30. In addition, the coloring layer 36B is disposed corresponding to the sub-pixel 18B, and the coloring layer 36R is disposed corresponding to the sub-pixel 18R.

A method of manufacturing the organic EL device 300 including the sub-pixel 18 which is provided with such a color filter 36 is basically the same method of manufacturing the organic EL device 100 of the first embodiment. Here, in the transparent layer forming step of step S2, the transparent layer 36T is formed in the sub-pixel 18G. In the coloring layer forming step of step S3, the coloring layer 36R is formed with respect to the sub-pixel 18R such that the coloring layer 36R covers the contact portions 31CB, 31CG, and 31CR. Thereafter, the coloring layer 36B is formed with respect to the sub-pixel 18B. The same is true for other steps.

According to the organic EL device 300 of the third embodiment and the method of manufacturing the same, the following effects can be obtained in addition to the above-described effects (2) and (3) of the first embodiment, and the effect (6) of the second embodiment.

(7) On the sealing layer 34, the coloring layer 36B is formed in the sub-pixel 18B, the coloring layer 36R is formed in the sub-pixel 18R, and the transparent layer 36T is formed in the sub-pixel 18G without forming the coloring layer. Accordingly, even though the light-emitting area in the sub-pixel 18G is smaller than that of the sub-pixel 18B or the sub-pixel 18R, it is possible to prevent the luminance from being weakened in the sub-pixel 18G, and is possible to provide or manufacture a PenTile type organic EL device 300 having a desired luminance.

(8) When the transparent layer 36T is disposed in the sub-pixel 18G having a small light-emitting area, it is possible to more suppress the current amount flowing into the organic EL element 30G than that flowing into each of the organic EL elements 30B and 30R while securing the luminance in the sub-pixel 18G. Accordingly, it is possible to provide or manufacture the PenTile type organic EL device 300 in which power consumption is more reduced than that of the case where the coloring layer 36G is disposed in the sub-pixel 18G.

In the invention, the sub-pixel 18 in which the transparent layer 36T is disposed is selected based on at least one of the following technical ideas (a) to (d).

(a) The sub-pixel 18 in which the color purity of the light components, which can be extracted without disposing the coloring layer, is more excellent than that of other sub-pixels (b) The sub-pixel 18 in which emission lifetime of the organic EL element 30 (the light-emitting function layer 32) is shorter than that of other sub-pixels (c) The sub-pixel 18 in which the light-emitting area of the organic EL element 30 (the light-emitting function layer 32) is smaller than that of other sub-pixels 18

(d) The sub-pixel 18 in which a density of current flowing into the organic EL element 30 (the light-emitting function layer 32) is to be smaller than that of other sub-pixels, in other words, the sub-pixel 18 in which the light-emitting area of the organic EL element 30 (the light-emitting function layer 32) is larger than that of other sub-pixels 18

It is possible to achieve at least one of the above-described effects in the embodiments without disposing the transparent layer 36T with respect to the aforementioned sub-pixels 18 of (a) to (d); however, in a case where the transparent layer 36T is not disposed, at the time of bonding the element substrate 10 and the protective substrate 40 via the filler 42, in the sub-pixel 18 in which the transparent layer 36T is not disposed cannot be sufficiently filled with the filler 42, and thus the element substrate 10 and the protective substrate 40 may be bonded to each other in a state of containing air bubbles. If the air bubbles are contained in the light-emitting area in the sub-pixel 18, the emitted light is scattered due to the air bubbles, which causes deterioration of the optical properties. In contrast, in the above-described embodiments, the transparent layer 36T is disposed in the sub-pixel 18, and thus it is possible to prevent the element substrate 10 and the protective substrate 40 from being bonded to each other in the state of containing the air bubbles.

In addition, in the pixel of the display unit, as the number of the sub-pixels 18 in which the transparent layer 36T is disposed instead of the coloring layer is increased, loads of exposure and development in the color filter forming step. With this, it is less likely that the sealing layer 34 which covers the organic EL element 30 comes in contact with a developer, a cleaning solution, or the like, and thus oxygen, moisture, or the like does not easily enter the organic EL element 30. For this reason, it is possible to obtain the effect of realizing the excellent light-emitting properties or emission lifetime in the organic EL device.

Fourth Embodiment

Electronic Device

Next, as an example of the electronic device which is provided with the organic EL device of the embodiment, a head-mounted display (HMD) will be described with reference to FIG. 22.

Figure 22:
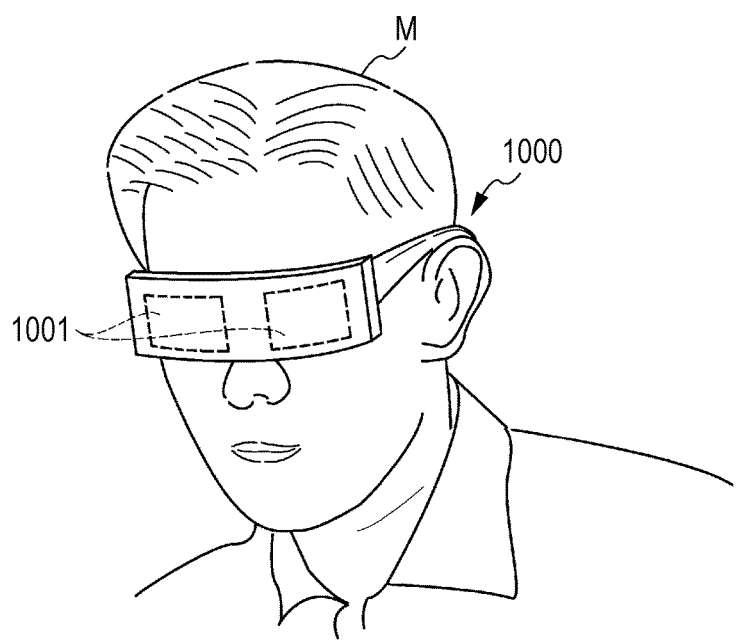
FIG. 22 is a schematic diagram of a head-mounted display as an example of an electronic device.

FIG. 22 is a schematic diagram of a head-mounted display as an example of an electronic device.

As illustrated in FIG. 22, a head-mounted display 1000 includes two display portions 1001 provided corresponding to left and right eyes. An observer M can see a texture and an image displayed on the display portion 1001 by mounting the head-mounted display 1000 on his head like glasses. For example, the observer M can enjoy a stereoscopic video as long as an image obtained by taking parallax between the display portions 1001 on the left and right into consideration is displayed.

At least one of the organic EL devices according to the above-described first the third embodiments is mounted on the display portion 1001. In the above-described embodiments, the transparent layer 36T is disposed in a state where any one of the coloring layers in the sub-pixels 18B, 18G, and 18R which can obtain light beams having different colors is omitted. Accordingly, a desired luminance in the sub-pixel 18 is realized by mounting the organic EL devices according to the above-described embodiments on the display portion 1001, and it is possible to provide the head-mounted display 1000 which has excellent display quality and power consumption reduced.

In addition, the electronic device on which any one of the organic EL devices according to the above-described first to third embodiments is mounted is not limited to the head-mounted display 1000. For example, the organic EL device may be mounted on an electronic device having a display portion, such as a head-mounted display (HUD), an electronic view finder (EVF) in a digital camera, a portable information terminal, and a navigator.

The invention is not limited to the above-described embodiments, and various modifications can be made within the scope without departing from the essence or spirit of the invention which can be understand from claims and the entire specification, and in accordance with such modifications, the electronic device to which the organic EL device and the method of manufacturing the organic EL device, and the organic EL device are applied is also intended to be included in the technical range of the invention. In addition the above-described embodiments, various Modification Examples can be considered. Hereinafter, Modification Examples will be described.

Modification Example 1

Figure 23:
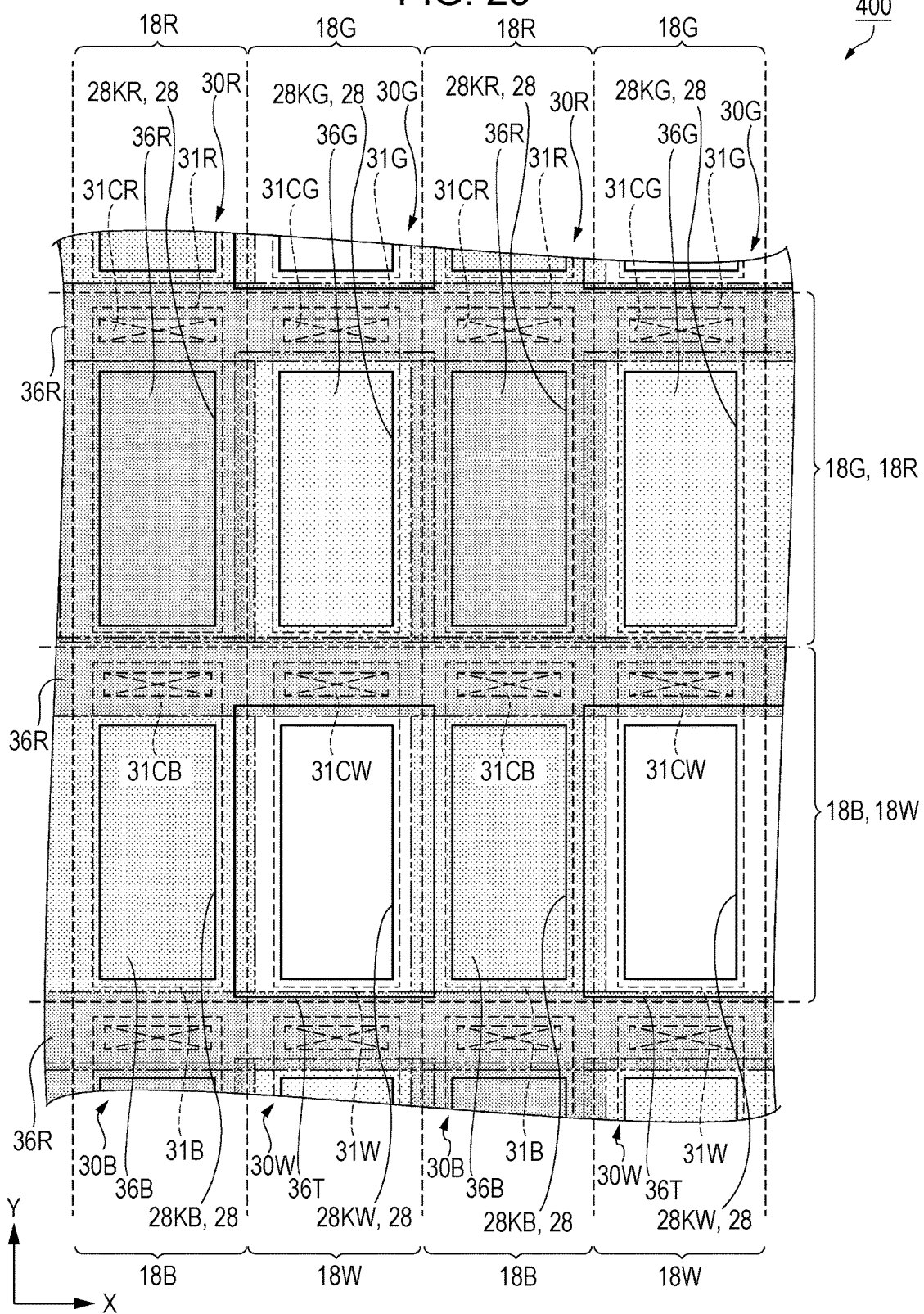
FIG. 23 is a schematic plan view illustrating the disposition of sub-pixels in an organic EL device of Modification Example.

The PenTile type disposition of the sub-pixels 18 is not limited to the disposition of the sub-pixels 18 in the organic EL device 300 of the third embodiment. FIG. 23 is a schematic plan view illustrating the disposition of sub-pixels in an organic EL device of Modification Example. As illustrated in FIG. 23, an organic EL device 400 of Modification Example includes a plurality of sub-pixels 18 which are arranged in a matrix shape in the X direction and the Y direction. The organic EL device 400 includes G and R lines in which a sub-pixel 18R and the sub-pixel 18G are alternatively disposed in the X direction, and B and W lines in which a sub-pixel 18B and a sub-pixel 18W are alternatively disposed in the X direction, in which the G and R lines and the B and W lines are alternatively arranged in the Y direction. A coloring layer 36B is disposed in the sub-pixel 18B, a coloring layer 36G is disposed in the sub-pixel 18G, and a coloring layer 36R is disposed in the sub-pixel 18R. A transparent layer 36T is disposed in an island shape in the sub-pixel 18W. The blue light (B) is emitted from the sub-pixel 18B, the green light (G) is emitted from the sub-pixel 18G, and the red light (R) is emitted from the sub-pixel 18R. The white light (W) is emitted from the sub-pixel 18W.

In the organic EL device 400 of Modification Example, a display unit is formed of four of the sub-pixels 18B, 18G, 18R, and 18W, which realize a color display. Note that, it is possible to properly set the size of opening portions 28KB, 28KG, 28KR, and 28KW of pixel electrodes 31B, 31G, 31R, and 31W in each of the sub-pixels 18B, 18G, 18R, and 18W. In addition, the organic EL device 400 is configuration to contain the white light emitted from the light-emitting function layer 32 of the organic EL elements 30B, 30G, 30R, and 30W which are disposed in the sub-pixels 18B, 18G, 18R, and 18W. According to this, it is possible to realize more bright display with the sub-pixel 18W for extracting the emitted white light.

Modification Example 2

In the organic EL devices according to the above-described first to third embodiments, the optical resonator structure is not limited to the structure in which the thickness of the transparent layer 26 is differentiated for each of the sub-pixels 18B, 18G, and 18R. For example, the thickness of each of the pixel electrodes 31B, 31G, and 31R may be differentiated for each of the sub-pixels 18B, 18G, and 18R, or may be differentiated for each of the sub-pixels 18B, 18G, and 18R by adjusting the thickness of each of the pixel electrodes 31B, 31G, and 31R and the transparent layer 26.

Modification Example 3

In the organic EL devices according to the first to third embodiments and Modification Example, the optical resonator structure is not essential. For example, the organic EL element which can obtain the light having a desire wavelength range may be independently disposed for each of the sub-pixels 18B, 18G, 18R, and 18W.

Modification Example 4

The coloring layer disposed on the upper layer of the contact portion of the pixel electrode 31 is not limited to the red coloring layer 36R, for example, the coloring layers having other colors may be disposed, or the coloring layers having different colors from each other may be disposed. In addition, the coloring layers having different colors from each other may be disposed on the upper layer of the contact portion in a state of being partially overlapped with each other.

Modification Example 5

The sub-pixel 18 in which the transparent layer 36T is disposed may be formed of at least one of three colors (B, G, and R). In addition, in a case where the sub-pixel 18 is formed of four or more colors, the coloring layer may be disposed in the sub-pixel 18 having a single color, and the transparent layer 36T may be disposed in the sub-pixel 18 having other colors.

The entire disclosure of Japanese Patent Application No. 2015-199159, filed Oct. 7, 2015 is expressly incorporated by reference herein.

What is claimed is:
1. An organic EL device comprising:
   a first substrate;
   a first organic EL element and a second organic EL element which are provided on the first substrate;
   a sealing layer which covers the first organic EL element and the second organic EL element; and
   a color filter which is provided on the sealing layer,
   wherein the color filter includes a coloring layer which overlaps the first organic EL element in a planar view, and a transparent layer which overlaps the entire second organic EL element but does not overlap the first organic EL element in the planar view, the second organic EL element does not have an overlapping coloring layer in the planar view, such that the second organic EL element transmits light that does not pass through a coloring layer.
2. The organic EL device according to claim 1,
   wherein the first organic EL element and the second organic EL element are disposed on the first substrate so as to be adjacent to each other in one direction, and
   wherein the transparent layer is provided between the first organic EL element and the second organic EL element in the one direction so as to come in contact with the coloring layer.
3. An electronic device comprising the organic EL device according to claim 2.
4. The organic EL device according to claim 1, further comprising:
   a first driving transistor which is provided on the first substrate, and is connected to the first organic EL element via a first contact portion; and
   a second driving transistor which is connected to the second organic EL element via a second contact portion,
   wherein the coloring layer is provided in such a manner that the first contact portion and the second contact portion are overlapped with each other in a planar view.
5. An electronic device comprising the organic EL device according to claim 4.
6. The organic EL device according to claim 1,
   wherein a main component of the coloring layer and the transparent layer is a photosensitive resin having light transmissivity.
7. The organic EL device according to claim 6,
   wherein the photosensitive resin is a photosensitive acrylic resin.
8. The organic EL device according to claim 1,
   wherein each of the first organic EL element and the second organic EL element include a pixel electrode having light transmissivity, a counter electrode having both light transmissivity and reflectivity, and a light-emitting function layer disposed between the pixel electrode and the counter electrode,
   wherein the organic EL device further comprise a reflective layer between a substrate main body of the first substrate and the pixel electrode, and
   wherein in the first organic EL element and the second organic EL element, optical distances between the reflective layer and the counter electrode are different from each other.
9. The organic EL device according to claim 1, further comprising:
   a second substrate having light transmissivity; and
   a filler provided between the second substrate and the color filter.
10. The organic EL device according to claim 1,
    wherein a light-emitting area of the second organic EL element is smaller than a light-emitting area of the first organic EL element.
11. The organic EL device according to claim 1,
    wherein the light-emitting area of the second organic EL element is larger than the light-emitting area of the first organic EL element.

12. An electronic device comprising the organic EL device according to claim 1.

13. The organic EL device according to claim 1, the second organic EL element including a pixel electrode having an opening portion, and the transparent layer overlapping the opening portion of the pixel electrode in the planar view.

14. An organic EL device comprising:

a first substrate;

a first organic EL element and a second organic EL element which are provided on the first substrate;

a sealing layer which covers the first organic EL element and the second organic EL element; and a color filter which is provided on the sealing layer, wherein the color filter includes a coloring layer which overlaps the first organic EL element in a planar view, and a resin layer which overlaps the entire second organic EL element but does not overlap the first organic EL element in the planar view, the second organic EL element does not have an overlapping coloring layer in the planar view, such that the second organic EL element transmits light that does not pass through a coloring layer, and wherein the coloring layer is formed of a resin which contains a coloring material, and the resin layer is formed of a resin which does not contain a coloring material.

15. An electronic device comprising the organic EL device according to claim 14.

* * * * *